(12) United States Patent
Shibata et al.

(10) Patent No.: US 9,287,242 B2
(45) Date of Patent: Mar. 15, 2016

(54) LIGHT EMITTING DEVICE, METHOD FOR MANUFACTURING LIGHT EMITTING DEVICE, ILLUMINATING DEVICE, AND BACKLIGHT

(75) Inventors: Akihide Shibata, Osaka (JP); Tetsu Negishi, Osaka (JP); Kenji Komiya, Osaka (JP); Hiroshi Iwata, Osaka (JP); Akira Takahashi, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 95 days.

(21) Appl. No.: 13/582,951

(22) PCT Filed: Jan. 25, 2011

(86) PCT No.: PCT/JP2011/051318
§ 371 (c)(1),
(2), (4) Date: Sep. 5, 2012

(87) PCT Pub. No.: WO2011/108309
PCT Pub. Date: Sep. 9, 2011

(65) Prior Publication Data
US 2012/0326181 A1    Dec. 27, 2012

(30) Foreign Application Priority Data

Mar. 5, 2010 (JP) .................................. 2010-049455
Dec. 28, 2010 (JP) .................................. 2010-292712

(51) Int. Cl.
*H01L 33/00* (2010.01)
*H01L 25/075* (2006.01)
(Continued)

(52) U.S. Cl.
CPC ............. *H01L 25/0753* (2013.01); *H01L 33/06* (2013.01); *H01L 33/24* (2013.01);
(Continued)

(58) Field of Classification Search
CPC   B82Y 20/00; H01L 29/0665; H01L 29/0673; H01L 21/02603; H01L 2221/1094; H01L 29/068; F21K 9/00; F21Y 2101/02; F21Y 2105/001; Y10S 977/762
See application file for complete search history.

(56) References Cited

U.S. PATENT DOCUMENTS 7,989,840 B2    8/2011  Sanpei et al.
2005/0079659 A1*  4/2005  Duan et al. .................... 438/197
(Continued)

FOREIGN PATENT DOCUMENTS

JP    2001-184921    7/2001
JP    2005-524989    8/2005
(Continued)

OTHER PUBLICATIONS

Hayden, O., Greytak, A., Bell, D. "Core-shell Nanowire Light-Emitting Diodes" in Advanced Materials. Mar. 22, 2005. Wiley-VCH GmbH & Co. 2005, 17, No. 6. pp. 701-704.*
(Continued)

*Primary Examiner* — Julio J Maldonado
*Assistant Examiner* — Cory Eskridge
(74) *Attorney, Agent, or Firm* — Morrison & Foerster LLP

(57) ABSTRACT

In a light emitting device, one hundred or more bar-like structured light emitting elements (210) each having a light emitting area of $2,500\pi$ μm$^2$ or less are placed on a mounting surface of one insulating substrate (200), so that the light emitting device fulfills little variation in luminance, long life, and high efficiency by dispersion of light emission with suppression of increase in temperatures in light emitting operations.

14 Claims, 30 Drawing Sheets

(51) Int. Cl.
*H01L 33/06* (2010.01)
*H01L 33/24* (2010.01)

(52) U.S. Cl.
CPC ............... *H01L2224/48091* (2013.01); *H01L 2224/49107* (2013.01); *H01L 2224/73265* (2013.01); *H01L 2924/09701* (2013.01); *H01L 2924/3011* (2013.01)

(56) References Cited

U.S. PATENT DOCUMENTS

| | | | |
|---|---|---|---|
| 2006/0169993 | A1 | 8/2006 | Fan et al. |
| 2006/0273328 | A1 | 12/2006 | Niu et al. |
| 2007/0152577 | A1* | 7/2007 | Cho et al. ............... 313/511 |
| 2008/0055901 | A1* | 3/2008 | Sanpei et al. ............. 362/235 |
| 2011/0254043 | A1 | 10/2011 | Negishi et al. |

FOREIGN PATENT DOCUMENTS

| | | |
|---|---|---|
| JP | 2007-157969 | 6/2007 |
| JP | 2008-85302 | 4/2008 |
| JP | 2009-10204 | 1/2009 |
| JP | 2009-147140 | 7/2009 |
| JP | 2011-86865 | 4/2011 |
| JP | 2011-91201 | 5/2011 |
| WO | WO-03/096387 | 11/2003 |

OTHER PUBLICATIONS

International Search Report dated Mar. 8, 2011, directed to International Application No. PCT/JP2011/051318; 4 pages.
Murakami G., (May 2009). "No. 13 Transition of Semiconductor Packaging Technology for LEDs and LDs," *Semiconductor FPD World:* 114-117. With partial English Translation.

* cited by examiner

S=2,500 π μ m²

S=2,500 π μ m²

S=2,500 π μ m²

LIGHT EMITTING DEVICE, METHOD FOR MANUFACTURING LIGHT EMITTING DEVICE, ILLUMINATING DEVICE, AND BACKLIGHT

REFERENCE TO RELATED APPLICATIONS

This application is a national stage application under 35 USC 371 of International Application No. PCT/JP2011/051318, filed Jan. 25, 2011, which claims the priority of Japanese Patent Application Nos. 2010-049455, filed Mar. 5, 2010, and 2010-292712, filed Dec. 28, 2010, the entire contents of which are incorporated herein by reference.

FIELD OF THE INVENTION

The present invention relates to a light emitting device, a method for manufacturing the light emitting device, an illuminating device, and a backlight.

BACKGROUND OF THE INVENTION

As shown in FIG. 36, there has been a conventional light emitting device formed by a process in which one LED chip (or several LED chips) 710 are mounted on a package substrate 700 mounted with lead frames 701, in which an n-type electrode 705 and a p-type electrode 706 of the LED chip 710 are connected to the lead frames 701 by bonding wires 711 and 712, respectively, in which resin 722 containing fluorescent substances is thereafter applied on the LED chip 710 surrounded with reflector plates 721, and in which transparent resin 723 is applied on the resin 722 containing the fluorescent substances (see Non-Patent Literature 1, for instance). In the LED chip 710, a semiconductor layer 703 made of GaN is stacked on a sapphire substrate 702, and an active layer 704 is included in the semiconductor layer 703.

Hereinbelow, a method of heat radiation from the LED that is a conventional light emitting device will be described with use of FIG. 37 that is schematized. A common LED chip is in shape of a square with each side 500 μm long and has a thickness of 10 μm, for instance (light emitting area of 250,000 μm$^2$ (=500 μm×500 μm)). The size of the LED chip is sufficiently larger than thickness (e.g., 100 μm) of a thermally conductive substrate 801 that serves to efficiently dissipate heat from the LED. In this configuration, as shown in a schematic section of FIG. 37, heat produced by light emission flows out in a generally perpendicular direction toward the resin substrate 800 in parts except periphery of the LED chip 802. A metal film, a metal film with which an insulator film is coated, or the like is used as the thermally conductive substrate 801.

On the periphery of this LED chip 802, heat outflow in lateral directions in the thermally conductive substrate 801 is allowed, and thus quantity of heat outflow is increased. There is a problem in that resultant higher temperatures in center area than in the periphery in the active layer region (light emitting layer region) of the LED chip 802 lead to increase in temperatures of the active layer and consequent decrease in efficiency of light emission or lead to deterioration of transparent resin, fluorescent substances and/or the like that are adjacent thereto and decrease in life thereof.

The light emitting devices each having one LED chip (or several LED chips) installed therein have another problem of poor yield of the light emitting devices because variation in brightness, or luminance of the LED chips becomes variation in luminance of the light emitting devices as it is.

The light emitting devices have another problem in that concentration of luminous flux on an LED chip 901 mounted on a substrate 900, as shown in a schematic section of FIG. 39, results in deterioration of resin 902 covering the LED chip 901, which may cause decrease in efficiency of light emission therefrom and in life thereof (a thermally conductive substrate is omitted in FIG. 39).

Non-Patent Literature 1: Gen Murakami "No. 13 Transition of Semiconductor Packaging Technology for LEDs and LDs", Semiconductor FPD World, PRESS JOURNAL INC., May 2009, pp. 114-117 (FIG. 5)

SUMMARY OF THE INVENTION

It is an object of the invention to provide a light emitting device that is capable of fulfilling little variation in luminance, long life, and high efficiency by dispersion of light emission with suppression of increase in temperatures in the light emitting operation, and a method of manufacturing the light emitting device.

It is another object of the invention to provide an illuminating device that is capable of fulfilling little variation in luminance, long life, and high efficiency by use of the light emitting device.

It is still another object of the invention to provide a backlight that is capable of fulfilling little variation in luminance, long life, and high efficiency by use of the light emitting device.

As a solution, in a light emitting device according to an aspect of the present invention, one hundred or more light emitting elements each having a light emitting area of $2,500\pi$ μm$^2$ or less are placed on a mounting surface of one substrate.

The light emitting elements are not limited to light emitting elements having flat light emitting surfaces in shape of circles, ellipses, squares, rectangles, polygons or the like but may be light emitting elements having light emitting surfaces formed of curved surfaces in shape of cylinders, ridges, hemispheres or the like. The light emitting elements are in direct contact with the substrate or are in contact with the substrate through a thermal conductor and those light emitting elements in contact therewith in both manners may be combined.

In the light emitting device in which the light emitting elements each having the area of the light emitting surface of $2,500\pi$ μm$^2$ or less are placed on the mounting surface of the one substrate, lateral heat outflow toward the substrate occurs also in a center part of each light emitting surface, with the light emitting elements being in direct contact (or indirect contact through the thermal conductor) with the substrate, and thus the temperatures of the light emitting element including the temperature of the center part of the light emitting surface are decreased, so that the increase in the temperatures in light emission is suppressed. By the placement of one hundred or more such minute light emitting elements on the mounting surface of the one substrate, variation in luminance in total on condition that the light emitting elements having a variation in luminance are gathered up can be decreased to not more than one-tenth of the variation in luminance of one light emitting element. There is a variation among elements in quantity of decrease in efficiency of light emission of the light emitting element that is caused by the increase in the temperatures thereof, whereas the setting of the area of the light emitting surface of each light emitting element to $2,500\pi$ μm$^2$ or less suppresses the increase in the temperatures and the variation in the quantity of decrease in the efficiency of light emission, further enhancing an effect of reducing the variation in luminance that is attained by using one hundred or more minute light emitting elements. Furthermore, the microminiaturization of the light emitting elements and the dispersive placement thereof on the mounting surface of the one substrate make it possible to reduce the light intensity by dispersion of light projected onto the resin, while the quantity of light as much as that of one light emitting element is obtained from the plurality of minute light emitting elements, for instance, and thus the suppression of deterioration of the resin and the extension of the life of the light emitting device can be attained. Thus, little variation in luminance, long life, and high efficiency can be fulfilled by such dispersion of light emission with the suppression of the increase in the temperatures in the light emitting operation.

In one embodiment, the light emitting area of each of the light emitting elements is not larger than $625\pi$ μm$^2$.

According to the embodiment, the light emitting elements having the area of the light emitting surface per each of $625\pi$ μm$^2$ or less are placed on the mounting surface of the one substrate, and thus extremely efficient lateral heat outflow toward the substrate occurs in the center part of the light emitting surface. Therefore, the increase in the temperatures in the light emitting operation is remarkably suppressed, so that further extension of the life and further increase in the efficiency of the light emitting device are attained.

In one embodiment, an area of the mounting surface of the substrate is equal to or larger than four times as large as a sum total of the light emitting areas of the light emitting elements, and the light emitting elements are placed on the mounting surface of the substrate while being dispersed uniformly in general.

In the embodiment, the light emitting elements are placed with generally uniform dispersion on the substrate having an area equal to or larger than four times the sum total of the light emitting areas of the light emitting elements, and thus lateral outflow of heat produced in the light emitting elements by light emission is efficiently caused, so that the suppression of the increase in the temperatures in the light emitting operation, the extension of the life and the increase in the efficiency are further attained.

As shown in FIGS. 40 and 41, for instance, light emitting elements 910 having light emitting surfaces that each have area of $2,500\pi$ μm2 or less and that are in shape of flat squares (with length a of each side) are placed on a square substrate 900 while being dispersed uniformly in general. Provided that an area of a portion of the substrate 900 that is assigned to one light emitting element 910 is four times ($4a^2$) the light emitting area ($a^2$) of the one light emitting element 910, light intensity can be decreased by the dispersion of the light emission from the light emitting elements 910 while sufficient distance between light emitting elements 910 adjacent to each other is ensured as shown in FIGS. 40 and 41 and thus deterioration of resin 912 can be suppressed, as compared with the conventional single light emitting element (LED chip 901) shown in FIG. 39.

In one embodiment, the light emitting elements are in shape of bars, and the light emitting elements are placed on the mounting surface of the substrate so that longitudinal directions of the light emitting elements parallel the mounting surface of the substrate.

According to the embodiment, the placement of the light emitting elements in shape of bars on the mounting surface of the substrate such that the longitudinal directions of the light emitting elements are parallel to the mounting surface of the substrate increases a ratio of a length in an axial direction (longitudinal direction) of the light emitting element to that in a radial direction thereof. This causes more efficient lateral heat outflow toward the substrate than in a configuration with flat square light emitting surfaces under condition that the areas of the light emitting surfaces are equal, making it possible to further enhance the suppression of the increase in the temperatures in the light emitting operation, the extension of the life, and the increase in the efficiency.

In one embodiment, the light emitting elements in shape of bars each have a cylindrical light emitting surface that concentrically surrounds a bar-like core.

Because the light emitting elements in shape of bars each have the cylindrical light emitting surface that concentrically surrounds the bar-like semiconductor core, it is possible to increase the area of the light emitting surface of each light emitting element, reduce the number of the light emitting elements required for obtaining a specified luminance, and reduce costs therefor, within a condition that the one hundred or more light emitting elements each having the area of the light emitting surface of $2,500\pi$ μm$^2$ or less are placed on the mounting surface of the one substrate.

In one embodiment, the light emitting elements are light emitting diodes. The light emitting diodes are connected between a first electrode and a second electrode that are formed with specified spacing between on the substrate. The light emitting diodes comprise first light emitting diodes each having an anode connected to the first electrode and a cathode connected to the second electrode and second light emitting diodes each having a cathode connected to the first electrode and an anode connected to the second electrode, the first and second light emitting diodes being mixed and placed on the substrate. And, the light emitting diodes are driven by an AC power supply applying AC voltages between the first electrode and the second electrode.

According to the embodiment, manufacturing process steps can be simplified because it is unnecessary to place the large number of light emitting diodes with unification of orientations of the anodes and the cathodes thereof. It is unnecessary to array the light emitting diodes connected between the first electrode and the second electrode with unification of polarity thereof, and thus a step of unifying the polarity (orientations) of the light emitting diodes in the manufacture is made unnecessary, so that the manufacturing process can be simplified. In addition, it is unnecessary to provide marks on the light emitting diodes in order to identify the polarity (orientations) of the light emitting diodes, and it is made unnecessary to form the light emitting diodes in special shape for the identification of the polarity. Accordingly, the steps for manufacturing the light emitting diodes can be simplified and costs for manufacturing the same can be reduced. On condition that the light emitting diodes are small in size and/or great in number, the manufacturing steps can noticeably be simplified as compared with arraying of light emitting diodes with the unification of the polarity thereof.

In one embodiment, the substrate is mounted on a radiator plate.

According to the embodiment, heat radiation effect is further improved by mounting the substrate on the radiator plate.

The present invention also provides a method of manufacturing a light emitting device in which one hundred or more light emitting elements each having a light emitting area of $2,500\pi$ μm$^2$ or less are placed on a mounting surface of one substrate, the method comprising:

a substrate production step of producing a substrate having at least a first electrode and a second electrode on a mounting surface thereof, an application step of applying solution containing a plurality of light emitting elements onto the substrate, and an arraying step of arraying the plurality of light emitting elements in positions defined at least by the first electrode and the second electrode by applying voltages at least to the first electrode and the second electrode.

According to the configuration, the substrate having at least the first electrode and the second electrode on the mounting surface is produced, and liquid containing a plurality of minute light emitting elements is applied onto the substrate. After that, the plurality of minute light emitting elements are arrayed in the positions, defined at least by the first electrode and the second electrode, by the application of the voltages at least to the first electrode and the second electrode. Thus the plurality of light emitting elements can easily be arrayed in the specified positions on the substrate. Accordingly, it is unnecessary to place light emitting diodes one by one in specified positions on a substrate as in conventional devices, and a large number of minute light emitting diodes can accurately be placed in the specified positions.

By the method of manufacturing the light emitting device, the light emitting device can be provided in which little variation in luminance, long life, and high efficiency can be fulfilled by the dispersion of light emission with the suppression of the increase in the temperatures in the light emitting operation. In the method of manufacturing the light emitting device, quantity of semiconductor that is used can be reduced by use of the semiconductor only for the plurality of minute light emitting elements.

In one embodiment, the method further comprises a substrate division step of dividing the substrate into a plurality of divided substrates after the arraying step. One hundred or more light emitting elements are placed on each of the plurality of divided substrates.

According to the embodiment, the plurality of light emitting elements are arrayed on the substrate having a large area, and then the substrate is divided into the plurality of divided substrates each having one hundred or more light emitting elements placed thereon, so that reduction in number of the substrates flowing in each step and substantial cost reduction can be attained.

In one embodiment, at least the first electrode and the second electrode are used as electrodes for driving the plurality of light emitting elements.

According to the embodiment, an interconnection step can be simplified and costs can be reduced by the use of at least the first electrode and the second electrode as the electrodes for driving the plurality of light emitting elements.

In one embodiment, the method further comprises, after the arraying step, a fluorescent substance application step of selectively applying fluorescent substance onto areas on the substrate where the plurality of light emitting elements are placed.

According to the embodiment, cost reduction through saving in used amount of the fluorescent substance of which a material cost makes up a large percentage of a total material cost can be attained by the selective application of the fluorescent substance onto the areas on the substrate where the plurality of light emitting elements are placed after arraying of the plurality of light emitting elements on the substrate.

In one embodiment, the plurality of light emitting elements are in shape of bars, and the plurality of light emitting elements are placed on the mounting surface of the substrate so that longitudinal directions of the plurality of light emitting elements parallel the mounting surface of the substrate.

According to the embodiment, the method of manufacturing the light emitting device, which makes use of polarization of an object by application of voltage between electrodes, is convenient for causing polarization of both ends of the bar-like light emitting element and congenial to the bar-like light emitting element.

In one embodiment, the light emitting elements in shape of bars each have a cylindrical light emitting surface that concentrically surrounds a bar-like core.

According to the embodiment, due to the bar-like light emitting elements each having the cylindrical light emitting surface that concentrically surrounds the bar-like semiconductor core, it is possible to increase the area of the light emitting surface of each light emitting element and reduce number of the light emitting elements required for obtaining a specified luminance, within a condition that the one hundred or more bar-like light emitting elements having the area of the light emitting surface per each of $2,500\pi$ $\mu m^2$ or less are placed on the mounting surface of the one substrate.

In one embodiment, the light emitting elements in shape of bars each have a first conductive type bar-like semiconductor core and a second conductive type cylindrical semiconductor layer that is formed so as to cover an outer periphery of the semiconductor core, and one end part of the semiconductor core of each of the light emitting elements in shape of bars is exposed.

According to the embodiment, the bar-like light emitting elements each having the first conductive type bar-like semiconductor core and the second conductive type cylindrical semiconductor layer that is formed so as to cover the outer periphery of the semiconductor core with the one end part of the semiconductor core exposed facilitate interconnections because connection of one electrode to the exposed one end part of the semiconductor core and connection of the electrode to the semiconductor layer on the other end part of the semiconductor core can be attained with the electrodes connected to both the ends with spacing therebetween so that short circuit between the electrode connected to the semiconductor layer and the exposed part of the semiconductor core is prevented.

An illuminating device according to an aspect of the present invention comprises the light emitting device according to any one of the embodiments as mentioned above.

Use of the light emitting device in the illuminating device makes it possible to achieve little variation in luminance, long life, and high efficiency.

A backlight according to the present invention comprises the light emitting device according to any one of the embodiments as mentioned above.

Use of the light emitting device in the backlight makes it possible to achieve little variation in luminance, long life, and high efficiency.

As is apparent from the above, according to the present invention, a light emitting device is attained in which little variation in luminance, long life, and high efficiency are fulfilled by the dispersion of light emission with the suppression of the increase in the temperatures in the light emitting operation.

Also, according to the present invention, an illuminating device with little variation in luminance, long life, and high efficiency is attained by using the light emitting device.

Furthermore, according to the present invention, a backlight with little variation in luminance, long life, and high efficiency is attained by using the light emitting device.

DETAILED DESCRIPTION OF THE INVENTION

Prior to description on embodiments of a light emitting device, a method for manufacturing the light emitting device, an illuminating device, and a backlight of the invention, characteristics of the light emitting device of the invention will be described.

The light emitting device of the invention is characterized in that one hundred or more light emitting elements each having a light emitting surface of $2,500\pi$ $\mu m^2$ or less (more preferably $625\pi$ $\mu m^2$ or less) in area are placed on a mounting surface of one substrate. The light emitting elements are not limited to light emitting elements having flat light emitting surfaces in shape of circles, ellipses, squares, rectangles, polygons or the like but may be light emitting elements having light emitting surfaces formed of curved surfaces in shape of cylinders, ridges, hemispheres or the like.

Figure 38:
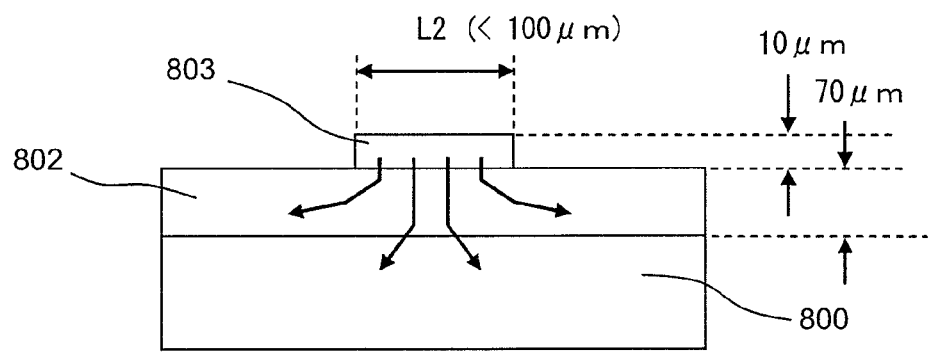
FIG. 38 is a schematic section for illustrating heat outflow in a light emitting device in accordance with the invention.

Provided that the light emitting surfaces of the 100 or less light emitting elements placed on the mounting surface of the one substrate are in shape of flat circles, for instance, the light emitting surfaces having a diameter smaller than 100 $\mu m$ (an area of $2,500\pi$ $\mu m^2=\pi*50*50$ $\mu m^2$) involve a distance shorter than 50 $\mu m$ from any point on a light emitting surface of the light emitting element to an outer edge thereof and cause lateral heat outflow toward the substrate even in center parts of the light emitting surfaces. Thus temperatures of the light emitting elements including those of the center parts of the light emitting surfaces are decreased, so that increase in the temperatures in light emission is suppressed. FIG. 38 shows heat outflow under a condition that the diameter of the light emitting surface of the light emitting element 803 is smaller than 100 $\mu m$, and the lateral heat outflow toward the substrate occurs in the center part also of the light emitting surface of the light emitting element 803, as shown in FIG. 38.

Figure 42:
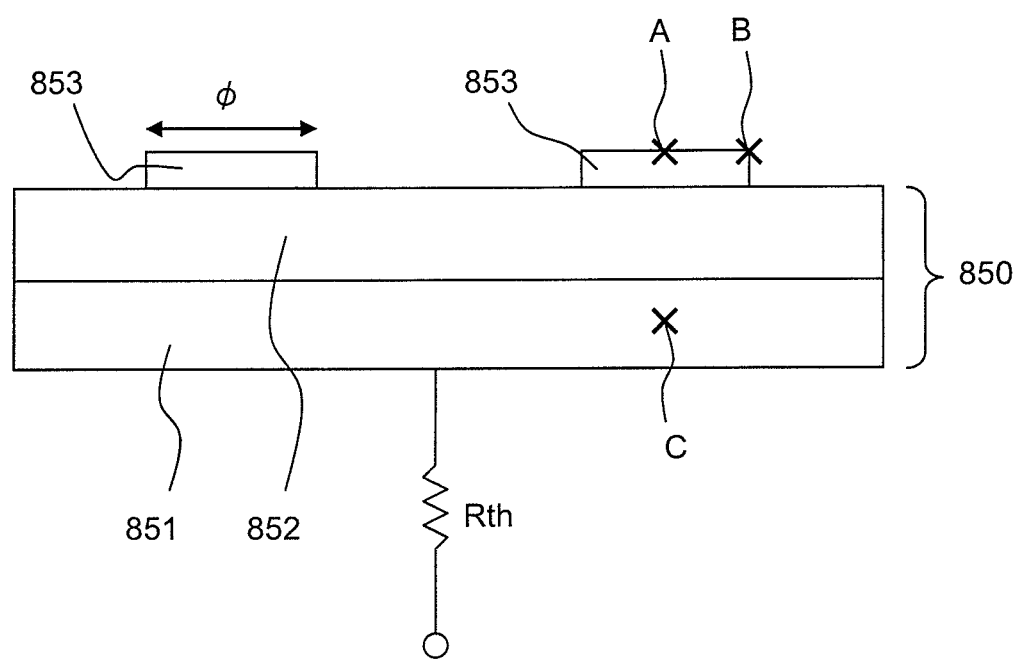
FIG. 42 is a diagram showing a model used for a thermal simulation.

Subsequently, the temperatures of the light emitting element, in operation, having the light emitting surface in shape of the flat circle will be illustrated by thermal simulation. FIG. 42 shows a model used for the simulation. A thermally conductive substrate 850 is assumed to be a common substrate on which LEDs are to be mounted, and has a 50 $\mu m$ thick aluminum substrate 851 coated with a 50 $\mu m$ thick resin coating 852 for insulation. The thermally conductive substrate 850 had a diameter of 10 cm. LED chips 853 with a diameter $\phi$ in which a light emitting layer made of GaN was formed on a 10 $\mu m$ thick sapphire substrate were placed on the resin coating 852. Herein, a total area ($40000\pi$ $m^2$) of light emitting surfaces of the LED chips 853 placed on the resin coating 852 was restricted so as to be constantly fixed. That is, halving the diameter $\phi$ of the LED chips 853 involved quadrupling the number of the LED chips 853, which were arranged equally in general on the resin coating 852. This is for equalizing quantities of produced heat even though the diameter φ of the LED chips 853 is changed. The thermally conductive substrate 850 was connected to the environment having a room temperature (27° c.) through a thermal resistance Rth. The thermal resistance Rth reflects thermal resistances of a resin substrate laid under the thermally conductive substrate 850, metal provided in a heat radiation path, and radiation fins, and thermal resistances between the radiation fins and atmosphere.

Thermal conductivities used for the thermal simulation were 237 W/mK in the aluminum substrate 851, 0.5 W/mK in the resin coating 852, and 35 W/mK in the sapphire substrate. The thermal resistance Rth was set at 75° C./W. Heat generation density of the light emitting surfaces was set at $10^6$ W/m$^2$.

Figure 43:
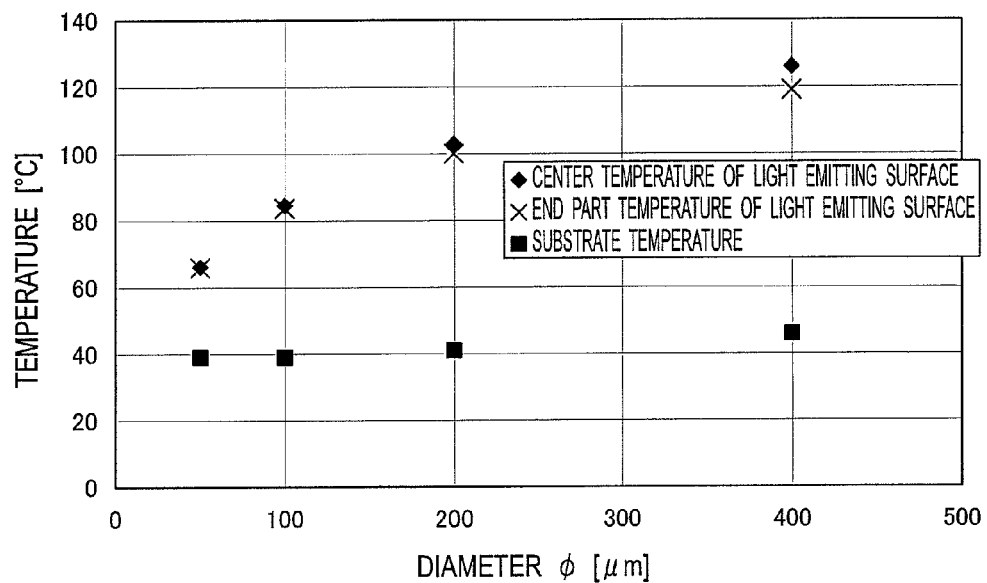
FIG. 43 is a graph showing temperatures of parts with respect to diameters of an LED chip.

FIG. 43 is a graph showing temperatures of parts that were calculated by the thermal simulation. In FIG. 43, sign "♦" denotes a center temperature of the light emitting surface in a steady state (temperature at a point A in FIG. 42), sign "x" denotes an end part temperature of the light emitting surface (temperature at a point B in FIG. 42), sign "■" denotes a substrate temperature (temperature of the aluminum substrate 851 just under the LED chip 853 (temperature at a point C in FIG. 42)), and dependence on the diameter φ of the LED chip 853 is shown therein. The substrate temperature did not so change with change in the diameter φ, because the total quantity of produced heat was fixed.

Figure 44:
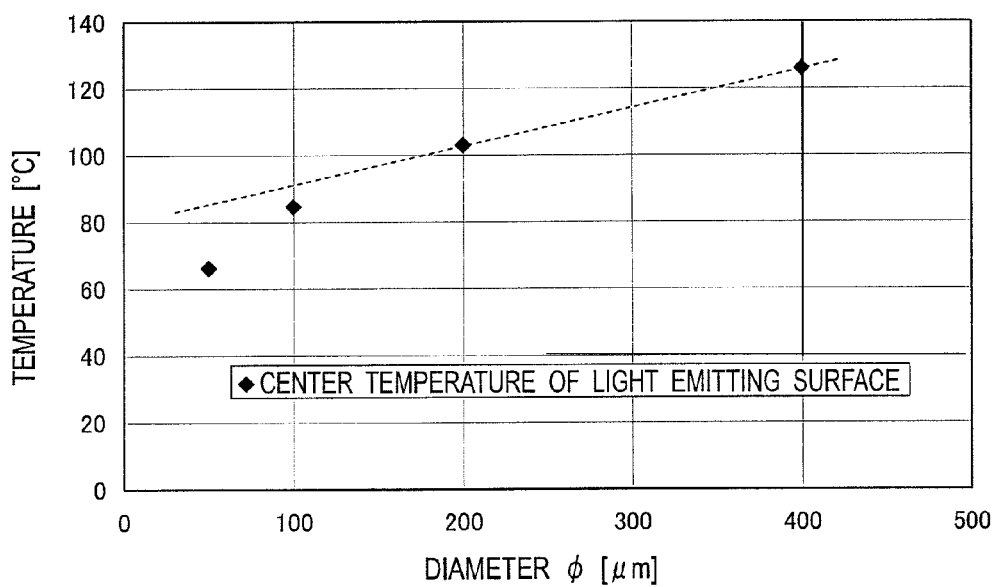
FIG. 44 is a graph showing center temperatures of a light emitting surface with respect to the diameters of the LED chip.

FIG. 44 is a graph showing only the center temperatures of the light emitting surface. It is observed that the diameter of the LED chips 853 not larger than 100 μm ($2,500\pi$ μm$^2$=π*50*50 μm$^2$ in area) causes sharp decrease in the center temperature of the light emitting surface (the decrease in the temperature becomes conspicuous in comparison with a declining trend in the center temperature of the light emitting surface that is shown by a dotted line in FIG. 44). This suggests that the lateral heat outflow toward the substrate occurs in the center part also on the light emitting surface, i.e., that a state represented in FIG. 38 is attained. The center of the light emitting surface is a portion having the highest temperature in the light emitting element, and thus the decrease in the temperature thereat implies increase in efficiency of the light emitting element and suppression of deterioration of the resin, the fluorescent substances and the like therearound, which may result in extension of life thereof and the like.

Figure 45:
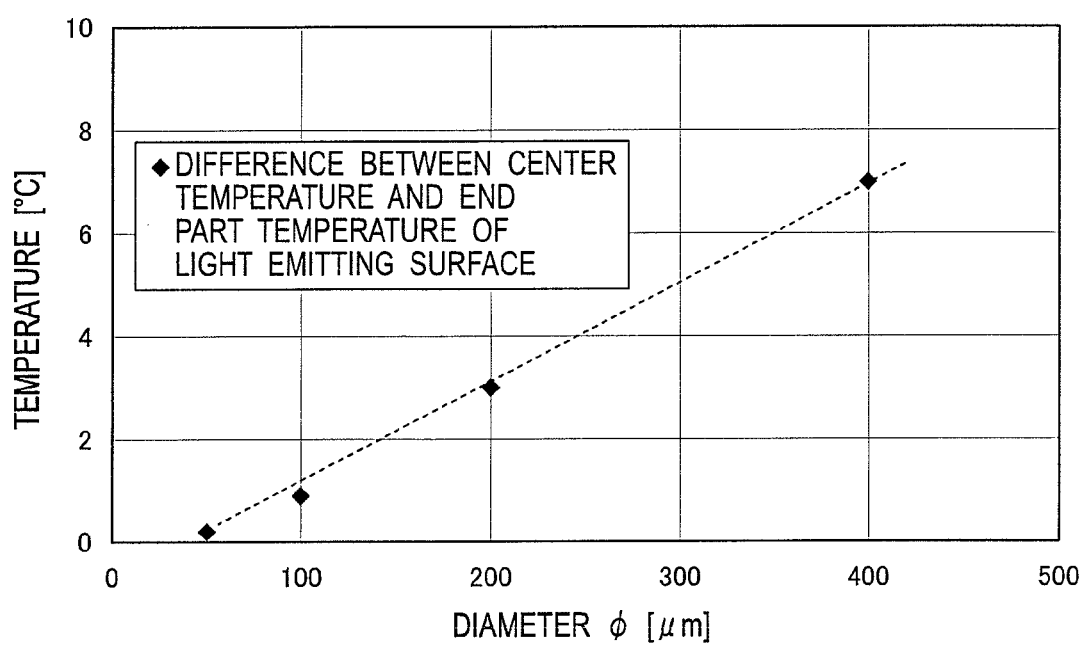
FIG. 45 is a graph showing difference between center temperature of the light emitting surface and end part temperature of the light emitting surface with respect to the diameters of LED chips.

FIG. 45 is a graph showing difference between the center temperature of the light emitting surface and the end part temperature of the light emitting surface. The difference between the center temperature of the light emitting surface and the end part temperature of the light emitting surface serves as an index showing extent to which the heat is accumulated in vicinity of the center of the light emitting surface. It is observed therein that the diameter of the LED chips 853 not larger than 50 μm ($625\pi$ μm$^2$=π*25*25 μm$^2$ in area) causes the difference between the center temperature of the light emitting surface and the end part temperature of the light emitting surface to become around zero (the decrease in the temperature becomes more conspicuous in comparison with the declining trend in the center temperature of the light emitting surface that is shown by the dotted line in FIG. 44). That is, it is shown that the diameter of the LED chips 853 not larger than 50 μm entirely prevents accumulation of the heat in vicinity of the center of the light emitting surface and ensures extremely efficient lateral heat outflow toward the substrate. Therefore, the increase in the temperature in light emission is remarkably suppressed, so that further extension of the life and further increase in the efficiency of the light emitting device are attained.

Figure 46A:
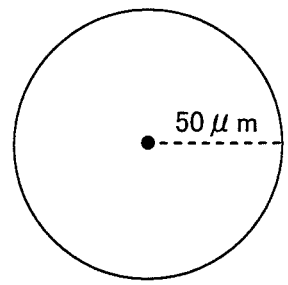
FIG. 46A is a diagram illustrating a light emitting element having a light emitting surface in shape of a flat circle.
Figure 46B:
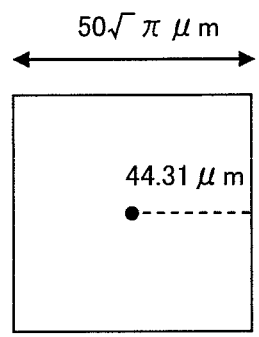
FIG. 46B is a diagram illustrating a light emitting element having a light emitting surface in shape of a flat square.
Figure 46C:
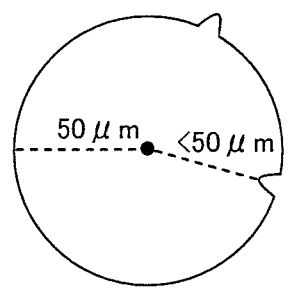
FIG. 46C is a diagram illustrating a variant in which minute deformation is added to the circle with its area fixed.

Hereinabove, the light emitting elements having the light emitting surfaces in shape of the flat circles have been described (see FIG. 46A). Subsequently, the light emitting surfaces that are flat and that have desired shapes will be examined. On condition that each light emitting surface of the light emitting elements is in shape of a flat square and has each side with a length of $50\sqrt{\pi}$μm ($2,500\pi$ μm$^2$=$50\sqrt{\pi}$*$50\sqrt{\pi}$ μm in area) as shown in FIG. 46B, for instance, the shortest distance from a desired point on the light emitting surface of the light emitting element to an outer edge thereof is smaller than 44.31 μm, so that the lateral heat outflow toward the substrate occurs in the center part also on the light emitting surface. No matter what minute deformation is added to the circle while the area thereof is fixed, as shown in FIG. 46C, the shortest distance from the center of the circle to outer edge thereof is decreased. That is, the light emitting element having the light emitting surface in shape of the flat circle is most resistant to heat dissipation therefrom provided that the light emitting surface has the same area, while the flat light emitting surfaces in other shapes of ellipses, squares, rectangles, polygons or the like necessarily cause the shortest distance from a desired point on the light emitting surface of each light emitting element to the outer edge thereof to be smaller than 50 μm, cause the lateral heat outflow toward the substrate in the center part also of the light emitting surface, and suppress the increase in the temperatures in light emitting operations, provided that the area of the light emitting surface is $2,500\pi$ μm$^2$ or less.

By a configuration in which the light emitting elements that are shaped like bars and that have the light emitting surfaces in shape of cylinders are placed on the mounting surface of the substrate so that longitudinal directions of the light emitting elements parallel the mounting surface of the substrate, for instance, distances from a desired point on the light emitting surface of the light emitting element to an outer edge thereof are made far shorter than those in the flat light emitting surface and thus the lateral heat outflow toward the substrate (toward both sides of an axis) is caused at any point on the light emitting surface, so that the increase in the temperatures in light emission is effectively suppressed.

By placement of one hundred or more such minute light emitting elements on the mounting surface of one substrate, a desired quantity of light can be obtained and the increase in the temperatures in light emitting operations can be suppressed.

Commonly, variation in luminance of light emitting elements may reach 50% depending on variation in forward voltage (Vf). Conventionally, light emitting elements that deviate from specifications are excluded by light-on testing or light emitting elements classified into groups each having similar luminance are used. When light emitting elements that have X % variation in luminance and that number in n are gathered up, however, variation in luminance in total is Y= X/√n [%]. Even on conditions of n=100 and 50% variation of light emitting elements, the variation in luminance in total becomes 5%, i.e., one-tenth, which satisfies the specifications. This eliminates necessity for the light-on testing of the light emitting elements and reduces costs thereof.

There has conventionally been the problem in that light emitted from the light emitting elements causes deterioration of resin covering the light emitting elements and shortens the lives thereof, whereas the invention in which the light emitting elements are microminiaturized and dispersively placed on the mounting surface of the one substrate makes it possible to reduce light intensity by dispersion of light projected onto the resin while making it possible to obtain a quantity of light as much as that of one light emitting element from the light emitting elements, for instance, and thus the suppression of the deterioration of the resin and the extension of the lives thereof can be attained.

In the light emitting device of the invention, little variation in luminance, long life, and high efficiency can be fulfilled by such dispersion of light emission with the suppression of the increase in the temperatures in the light emitting operation.

Hereinbelow, the light emitting device, a method for manufacturing the light emitting device, an illuminating device, and a backlight of the invention will be described in detail with reference to embodiments shown in the drawings. Though n-type GaN doped with Si and p-type GaN doped with Mg are used in the embodiments, impurity for doping of GaN is not limited thereto.

[First Embodiment]

Figure 1:
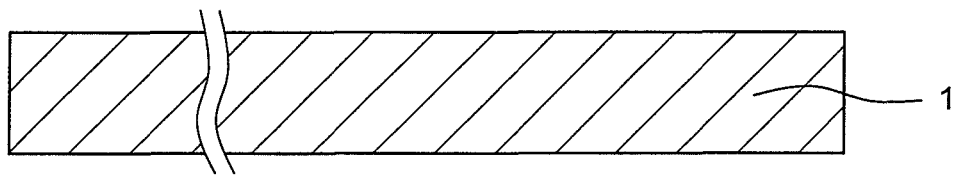
FIG. 1 is a process drawing of a method of manufacturing light emitting elements that are used for a light emitting device in accordance with a first embodiment of the invention.
Figure 2:
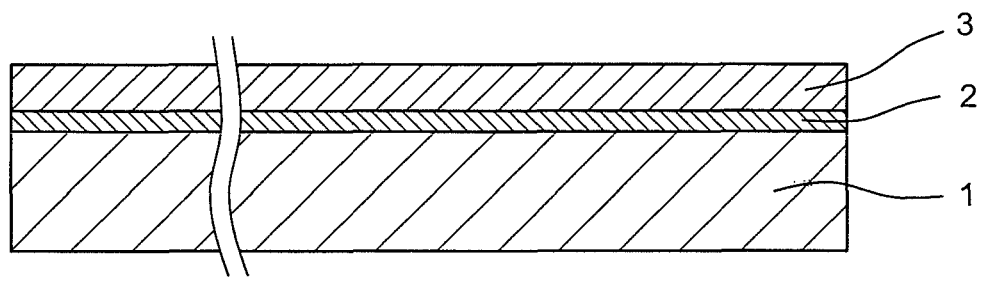
FIG. 2 is a process drawing following FIG. 1.
Figure 3:
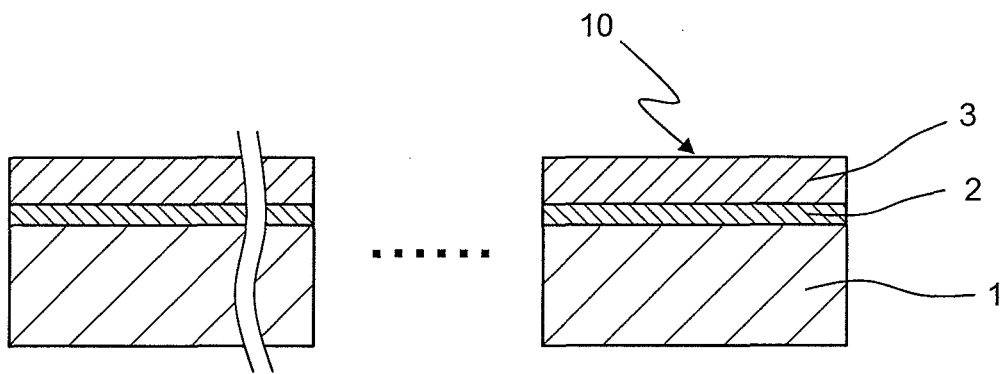
FIG. 3 is a process drawing following FIG. 2.

FIGS. 1 through 3 show process drawings of a method of manufacturing light emitting elements that are used for a light emitting device in accordance with a first embodiment of the invention. As shown in FIG. 2, a quantum well layer 2 made of p-type InGaN is deposited by epitaxial growth on an n-type GaN substrate 1 shown in FIG. 1, and a p-type GaN layer 3 is thereafter deposited by epitaxial growth on the quantum well layer 2.

As shown in FIG. 3, subsequently, the n-type GaN substrate 1 on which the quantum well layer 2 and the p-type GaN layer 3 are formed is divided by dicing into a plurality of semiconductor chips 10 as an example of light emitting elements. The divided semiconductor chips 10 are each shaped like a square with length of each side not greater than $50\sqrt{\pi}$ μm, have thickness of 10 μm, and each have a light emitting surface in shape of a flat square. Herein, light emitting area of each semiconductor chip 10 is $2,500\pi$ μm$^2$ (=$50\sqrt{\pi}$ μm×$50\sqrt{\lambda}$ μm) or less (more preferably $625\pi$ μm$^2$ or less). In the quantum well layer 2, a p-type AlGaN layer as an electron block layer may be interposed between the InGaN layer and the p-type GaN layer. There may be a multiple quantum well structure in which GaN barrier layers and InGaN quantum well layers are alternately stacked.

In the light emitting device of the first embodiment, one hundred or more semiconductor chips 10 shown in FIG. 3 are placed on a mounting surface of one substrate while being dispersed uniformly in general.

In the light emitting device in which a plurality of semiconductor chips 10 each having the area of the light emitting surface of $2,500\pi$ μm$^2$ or less (more preferably $625\pi$ μm$^2$ or less) are placed on the mounting surface of the one substrate, lateral heat outflow toward the substrate occurs also in a center part of each light emitting surface and thus the temperatures of the light emitting element including the temperature of the center part of the light emitting surface are decreased, so that the increase in the temperatures in light emission is suppressed. By the placement of one hundred or more such minute semiconductor chips 10 on the mounting surface of the one substrate, variation in luminance in total on condition that the plurality of semiconductor chips 10 having a variation in luminance are gathered up can be decreased to not more than one-tenth of the variation in luminance of one semiconductor chip 10. There is a variation among elements in quantity of decrease in efficiency of light emission of the semiconductor chip 10 that is caused by the increase in the temperatures thereof, whereas the setting of the area of the light emitting surface of each semiconductor chip 10 to $2,500\pi$ μm$^2$ or less (more preferably $625\pi$ μm$^2$ or less) suppresses the increase in the temperatures and the variation in the quantity of decrease in the efficiency of light emission, further enhancing an effect of reducing the variation in luminance that is attained by using one hundred or more minute semiconductor chips 10.

Furthermore, the microminiaturization of the semiconductor chips 10 and the dispersive placement thereof on the mounting surface of the one substrate make it possible to reduce the light intensity by dispersion of light projected onto the resin, while the quantity of light as much as that of one light emitting element is obtained from the plurality of minute semiconductor chips 10, for instance, and thus the suppression of deterioration of the resin and the extension of the life of the light emitting device can be attained.

In the light emitting device, little variation in luminance, long life, and high efficiency can be fulfilled by such dispersion of light emission with the suppression of the increase in the temperatures in the light emitting operation.

Herein, the plurality of light emitting elements are placed with generally uniform dispersion on the substrate having an area equal to or larger than four times the sum total of the light emitting areas of the plurality of semiconductor chips 10, and thus lateral outflow of heat produced in the light emitting elements by light emission is efficiently caused, so that the suppression of the increase in the temperatures in the light emitting operation, the extension of the life and the increase in the efficiency are further attained.

Though the light emitting elements each having the light emitting surface in shape of the flat square are used in the first embodiment, the light emitting elements of the invention are not limited thereto and may be those each having a flat light emitting surface in shape of circle, ellipse, rectangle, polygon or the like.

[Second Embodiment]

FIGS. 4 through 17 are process drawings sequentially showing a method of manufacturing light emitting elements in accordance with a second embodiment of the invention.

Figure 4:
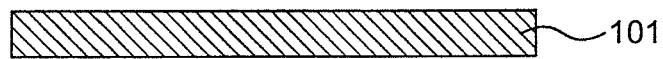
FIG. 4 is a process drawing of a method of manufacturing light emitting elements that are used for a light emitting device in accordance with a second embodiment of the invention.

In the second embodiment, as shown in FIG. 4, a prepared sapphire substrate 101 is initially cleaned.

Figure 5:
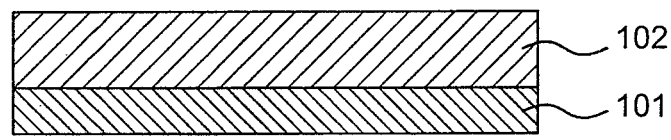
FIG. 5 is a process drawing following FIG. 4.

As shown in FIG. 5, subsequently, an n-type GaN film 102 is deposited on the sapphire substrate 101.

Figure 6:
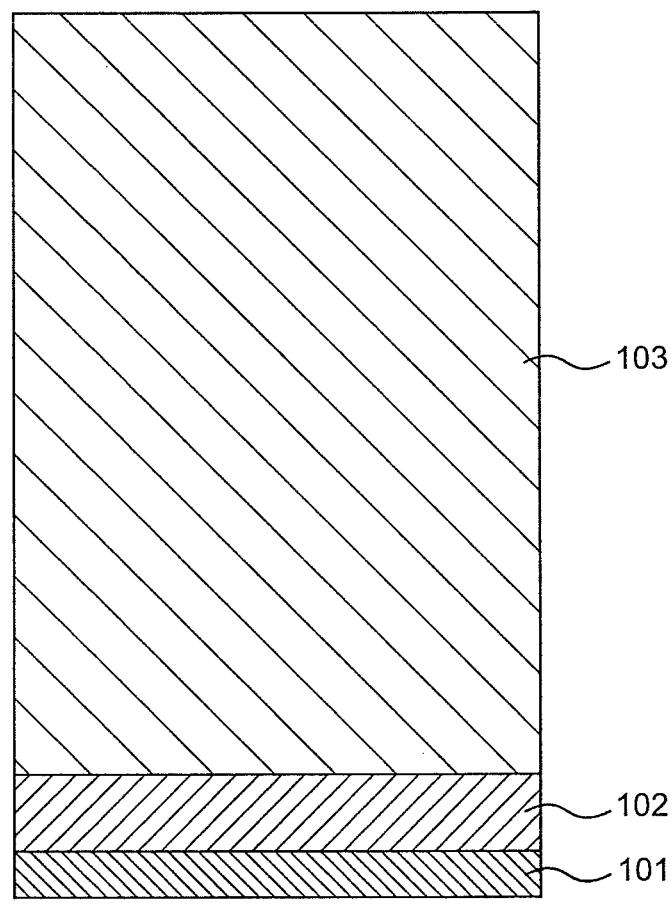
FIG. 6 is a process drawing following FIG. 5.

As shown in FIG. 6, subsequently, a mask layer 103 is formed by deposition on the n-type GaN film 102. The mask layer 103 is made of SiN or SiO$_2$, for instance.

Figure 7:
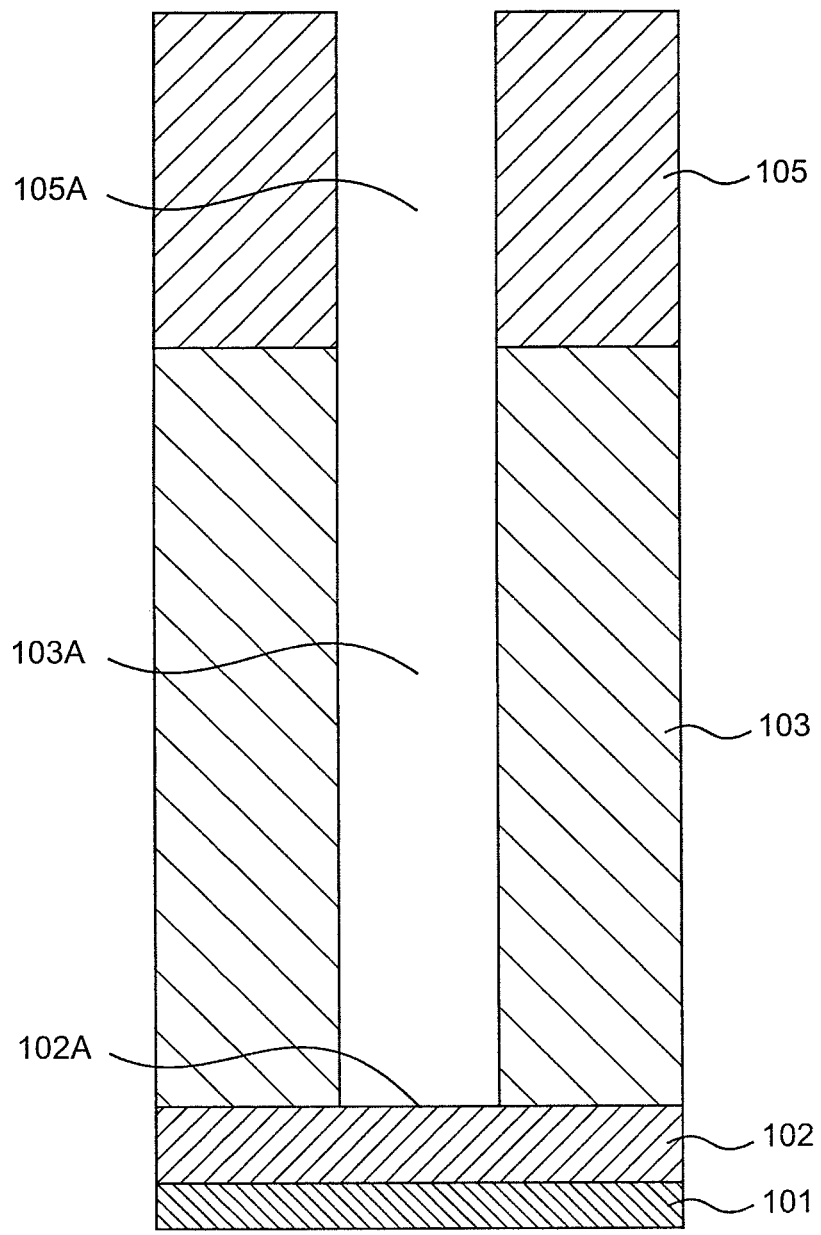
FIG. 7 is a process drawing following FIG. 6.

Subsequently, a resist layer 105 is applied on the mask layer 103, exposure and development are performed, and dry etching is performed, so that a hole 105A, 103A is formed in the resist layer 105 and the mask layer 103 as shown in FIG. 7. A part 102A of the n-type GaN film 102 is exposed by the holes 105A, 103A. The mask layer 103 serves as a growth mask, and the hole 103A formed in the mask layer 103 serves as a growth hole.

Figure 8:
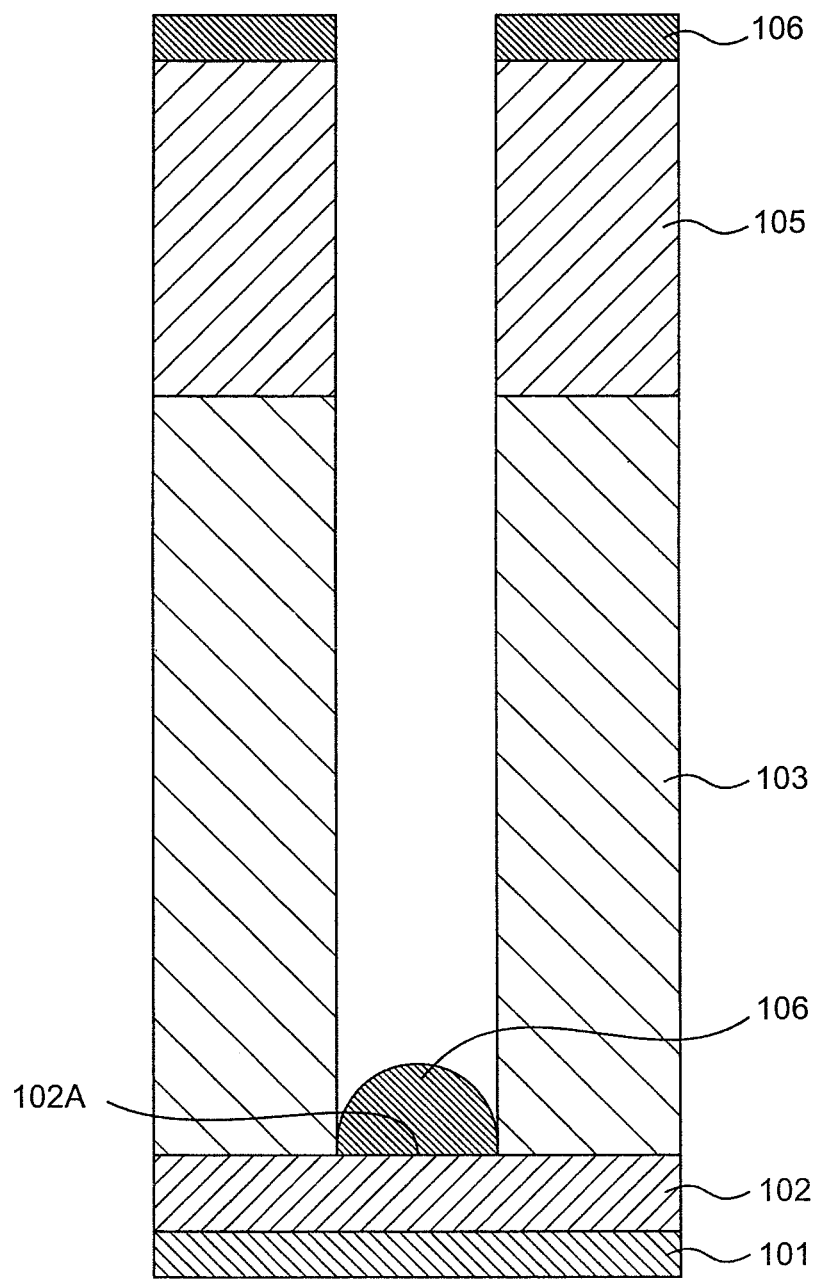
FIG. 8 is a process drawing following FIG. 7.

In a catalytic metal formation step as shown in FIG. 8, subsequently, catalytic metal 106 is deposited on the resist layer 105 and on the part 102A of the n-type GaN film 102 exposed in the hole 103A. As the catalytic metal 106, Ni, Fe or the like can be employed, for instance.

Figure 9:
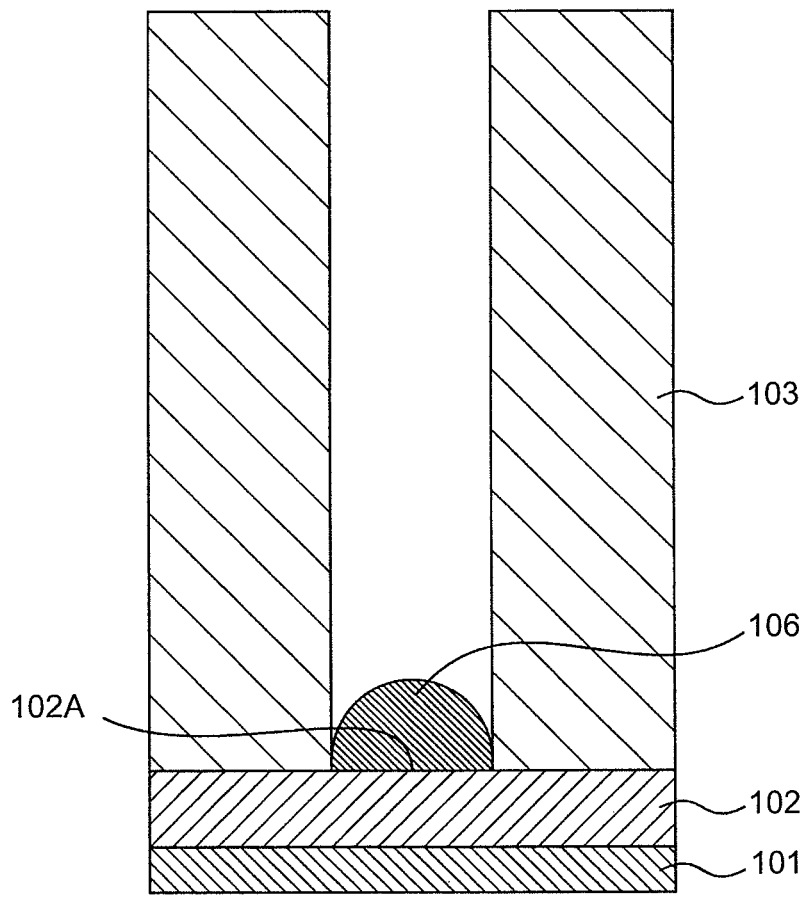
FIG. 9 is a process drawing following FIG. 8.

Subsequently, the resist layer 105 and the catalytic metal 106 on the resist layer 105 are removed by lift-off, so that the catalytic metal 106 on the part 102A of the n-type GaN film 102 is left behind as shown in FIG. 9, and cleaning is thereafter performed.

Figure 10:
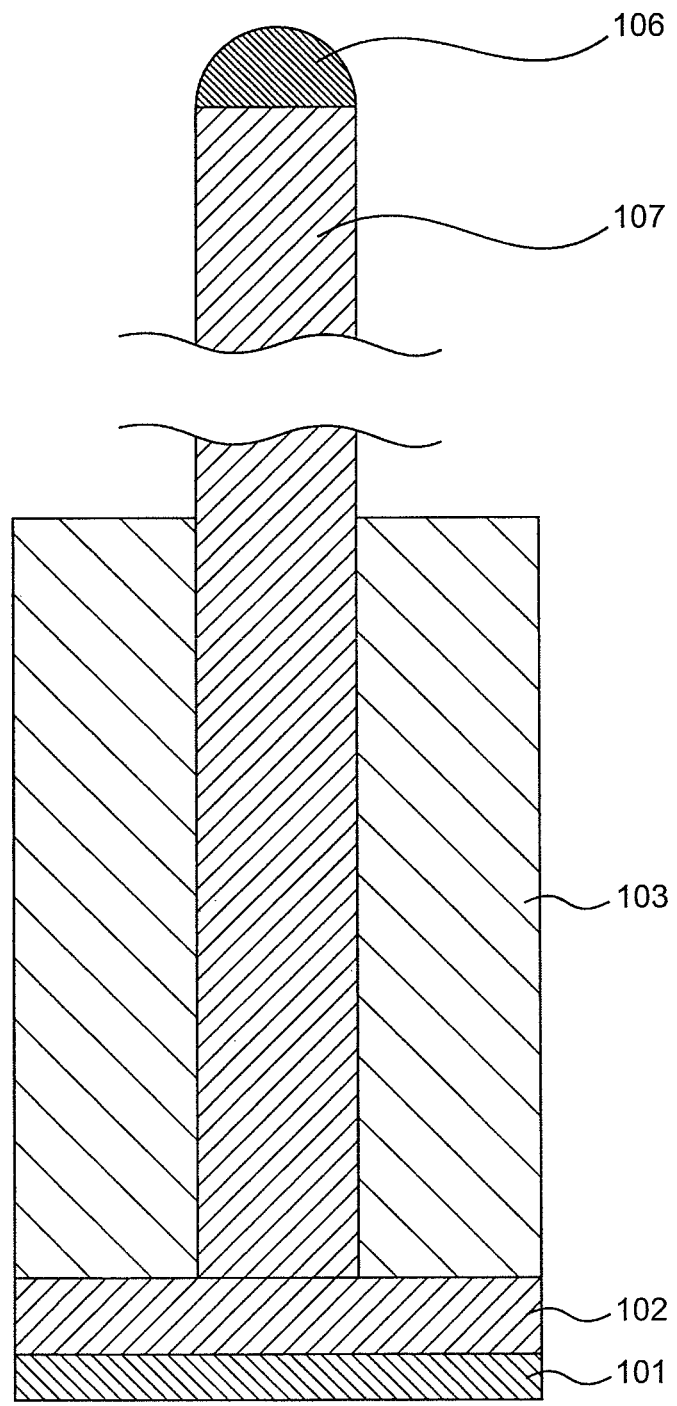
FIG. 10 is a process drawing following FIG. 9.

In a semiconductor core formation step, as shown in FIG. 10, an MOCVD (Metal Organic Chemical Vapor Deposition) device is used to cause crystal growth of n-type GaN and to form a semiconductor core 107 shaped like a bar having a generally hexagonal section in presence of the catalytic metal 106. The bar-like semiconductor core 107 is grown to 25 μm in length, for instance. The semiconductor core 107 of n-type GaN doped with Si can be grown by setting of growth temperature on the order of 800° C., use of trimethylgallium (TMG) and ammonia ($NH_3$) as growth gas, and supply of silane ($SiH_4$) for supply of n-type impurity and of hydrogen ($H_2$) as carrier gas. Herein, n-type GaN, which undergoes crystal growth of hexagonal system, is grown with a direction perpendicular to a surface of the sapphire substrate 101 set as c-axis direction, and the semiconductor core in shape of hexagonal prism is thereby obtained. Though depending on growth conditions such as growth direction and growth temperature, a section of the semiconductor core to be grown tends to have a nearly circular shape on condition that a diameter thereof is so small as to be on the order of tens of nanometers to hundreds of nanometers, and the growth with a generally hexagonal section tends to be facilitated on condition that the diameter is increased so as to be on the order of 0.5 µm to several micrometers.

A plurality of holes 105A in the resist layer 105 and a plurality of holes 103A in the mask layer 103 are formed, and the catalytic metal 106 is formed on the parts 102A at a plurality of sites on the n-type GaN film 102 that are exposed in the plurality of holes 105A, 103A, so that a plurality of bar-like semiconductor cores 107 are formed.

Figure 11:
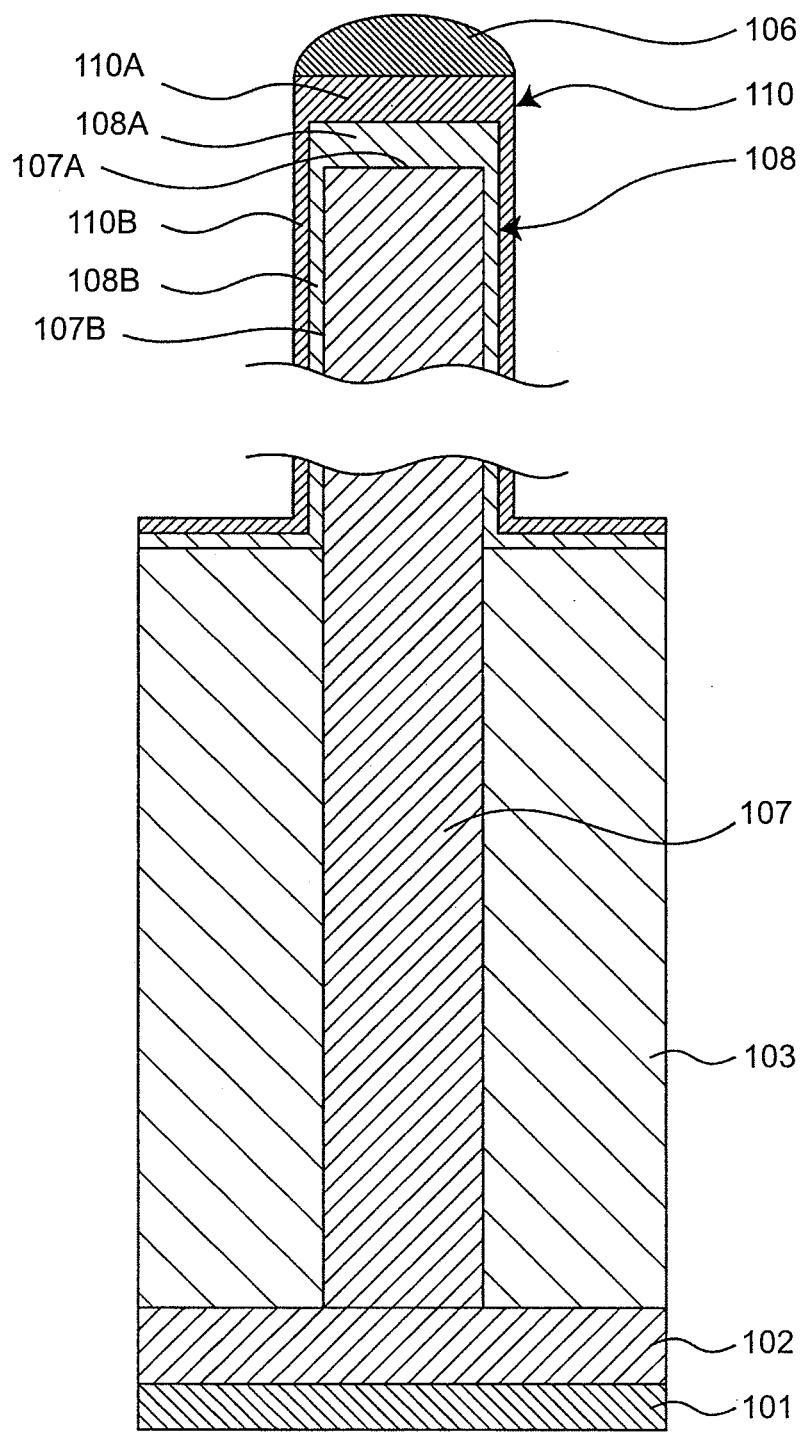
FIG. 11 is a process drawing following FIG. 10.

As shown in FIG. 11, subsequently, a quantum well layer 108 made of p-type InGaN is deposited by MOCVD so as to cover the semiconductor cores 107 made of n-type GaN and the mask layer 103. The quantum well layer 108 made of p-type InGaN can be formed on the semiconductor cores 107 of n-type GaN and the mask layer 103 by setting of preset temperature at 750° C. according to emission wavelength and supply of nitrogen ($N_2$) as carrier gas, TMG, $NH_3$ and trimethylindium (TMI) as growth gas. In the quantum well layer, a p-type AlGaN layer as an electron block layer may be interposed between an InGaN layer and a p-type GaN layer. There may be a multiple quantum well structure in which GaN barrier layers and InGaN quantum well layers are alternately stacked.

In a semiconductor layer formation step, as shown in FIG. 11, a semiconductor layer 110 made of p-type GaN is subsequently formed by MOCVD on the overall surface of the quantum well layer 108. The semiconductor layer 110 made of p-type GaN can be formed by setting of preset temperature at 900° C. and use of TMG and $NH_3$ as growth gas and $Cp_2Mg$ for supply of p-type impurity.

In growth of the quantum well layer 108 and the semiconductor layer 110 by MOCVD described above, the deposition there of is made to proceed in a state in which the catalytic metal 106 is attached thereto, and thus growth rates of parts between the catalytic metal 106 and extremity surfaces 107A of the semiconductor cores 107 are larger than, e.g., ten to one hundred times, those of parts covering side surfaces 107B of the semiconductor cores 107. In a specific example, the growth rates of GaN at sites to which the catalytic metal 106 adheres are 50 to 100 µm/h, while the growth rates of GaN at sites to which no catalytic metal adheres are 1 to 2 µm/h. In the quantum well layer 108 and the semiconductor layer 110, as a result, thicknesses of extremity parts 108A, 110A thereof are larger than thicknesses of side surface parts 108B, 110B, respectively.

Figure 12:
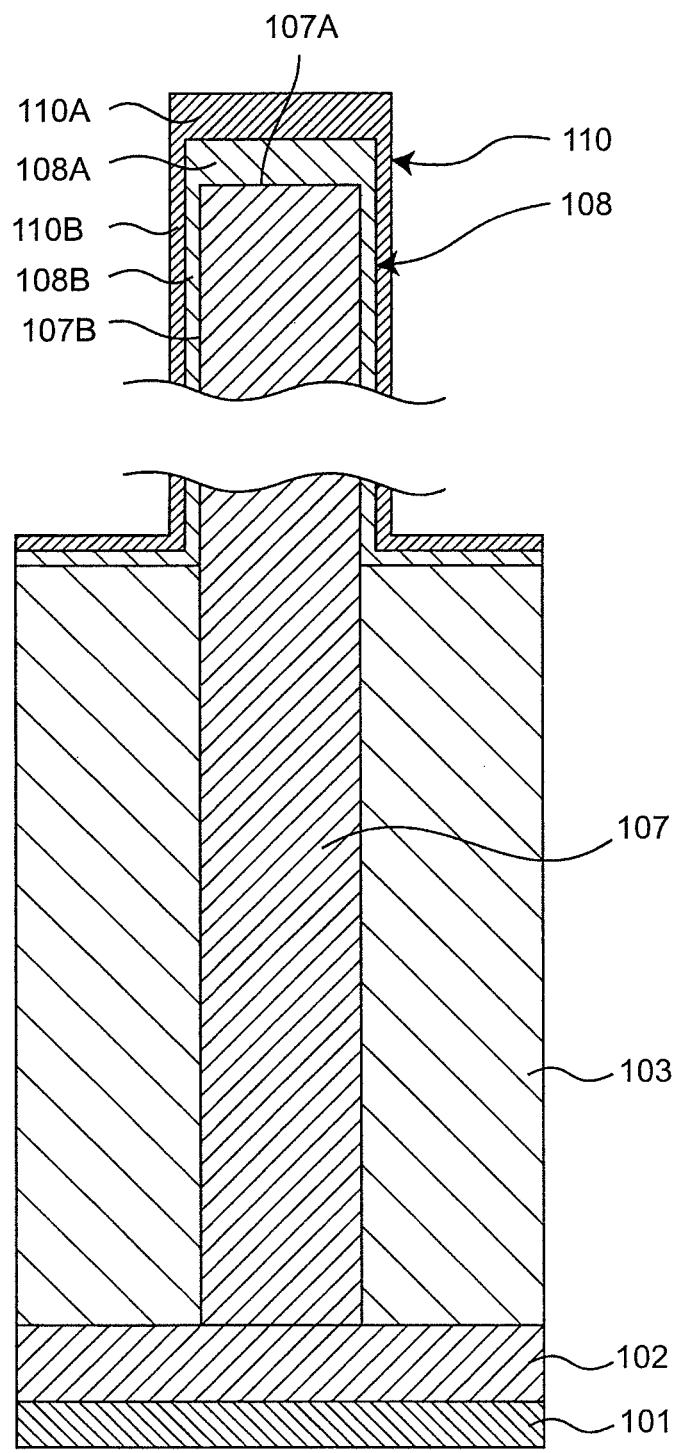
FIG. 12 is a process drawing following FIG. 11.

In a catalytic metal removal step as shown in FIG. 12, subsequently, the catalytic metal 106 on the semiconductor cores 107 is removed by etching, cleaning is thereafter performed, and the semiconductor layer 110 is activated by annealing. The thicknesses of the extremity parts 108A, 110A of the quantum well layer 108, the semiconductor layer 110 that cover the extremity surfaces 107A of the semiconductor cores 107 are larger than the thicknesses of the side surface parts 108B, 110B of the quantum well layer 108 and the semiconductor layer 110 that cover the side surfaces 107B of the semiconductor cores 107, and thus there is little risk that damages to and defects on metal removal surfaces may exert adverse effects on pn junctions. Besides, the semiconductor cores 107 can be prevented from being exposed from the semiconductor layer 110 in the etching.

Figure 13:
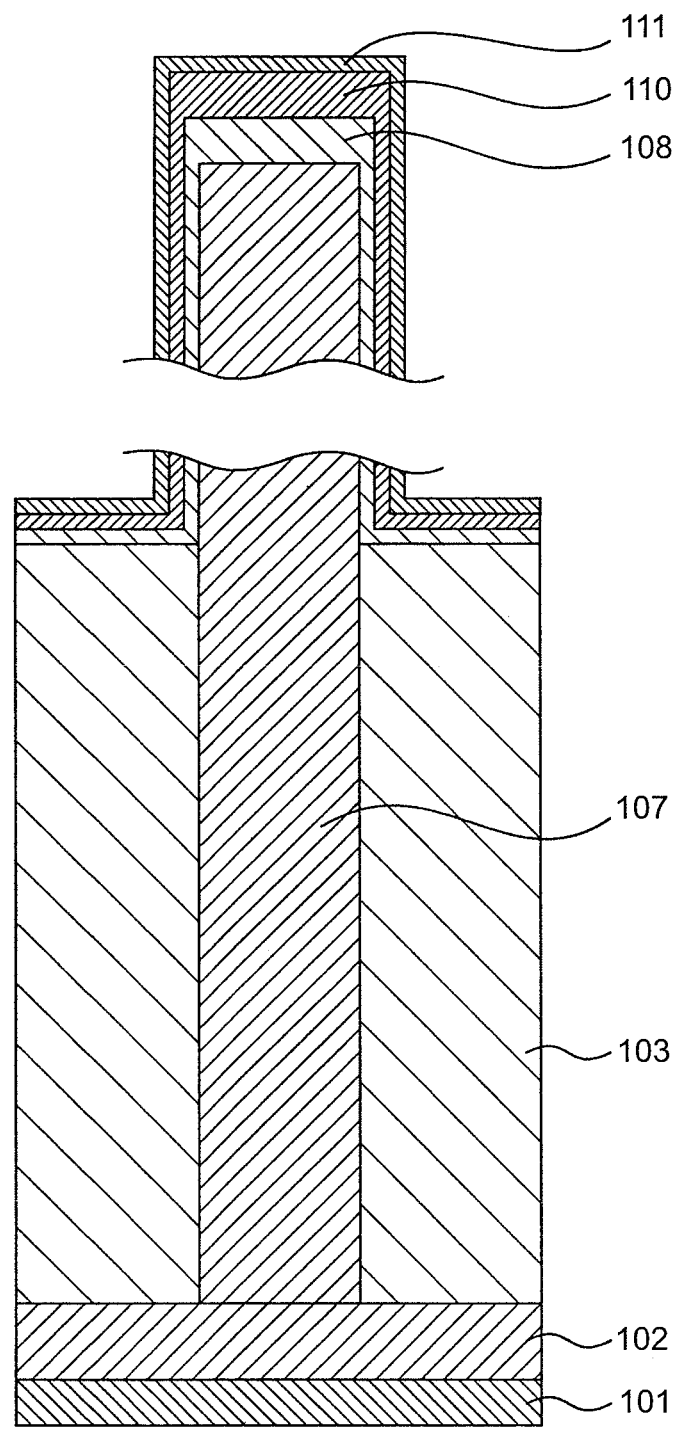
FIG. 13 is a process drawing following FIG. 12.

As shown in FIG. 13, subsequently, a conducting film 111 is formed on overall surface of the semiconductor layer 110 made of p-type GaN. Polysilicon, ITO (Indium Tin Oxide) or the like can be employed as material of the conducting film 111. The thickness of the conducting film 111 is 200 nm, for instance. Contact resistance between the semiconductor layer 110 made of p-type GaN and the conducting film 111 can be reduced by heat treatment at 500 to 600° C. after deposition of the conducting film 111. The conducting film 111 is not limited thereto and a translucent laminated metal film of Ag/Ni or Au/Ni having a thickness of 5 nm or the like may be used therefor, for instance. Evaporation method or sputtering method can be used for the deposition of the laminated metal film. In order to further reduce the resistance of the conducting layer, a laminated metal film of Ag/Ni or Au/Ni may be stacked on the conducting film of ITO.

Figure 14:
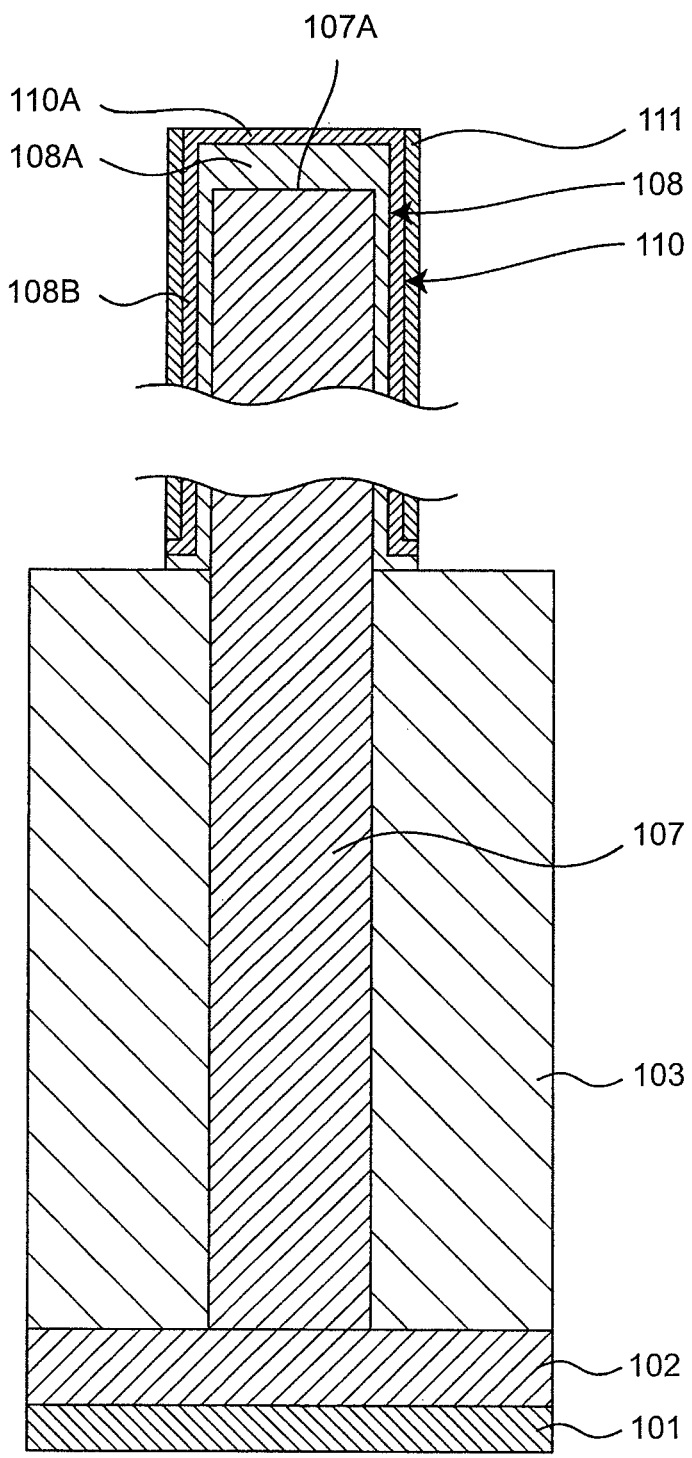
FIG. 14 is a process drawing following FIG. 13.

As shown in FIG. 14, subsequently, parts of the conducting film 111 that extend laterally on the semiconductor cores 107 and the mask layer 103 are removed by RIE (Reactive Ion Etching) of dry etching. By the RIE, portions having a thickness are removed from the extremity parts 110A of the semiconductor layer 110 that cover the extremity surfaces 107A of the semiconductor cores 107. By the RIE, portions of the semiconductor layer 110 that extend laterally on the mask layer 103 beyond the conducting film 111 are removed. By the RIE, portions of the quantum well layer 108 that extend laterally on the mask layer 103 beyond the conducting film 111 are removed.

The semiconductor cores 107 are prevented from being exposed in the extremity parts thereof after the RIE, because the thickness of the extremity parts 108A of the quantum well layer 108 is sufficiently larger than the thickness of the side surface parts 108B and because the thickness of the extremity parts 110A of the semiconductor layer 110 is sufficiently larger than the thickness of the side surface parts 110B before the RIE as described above. By the RIE, consequently, the quantum well layer 108 and the semiconductor layer 110 that cover the extremity surfaces of the semiconductor cores 107 and the quantum well layer 108, the semiconductor layer 110, and the conducting film 111 that cover the side surfaces of the semiconductor cores 107 are left behind.

Figure 15:
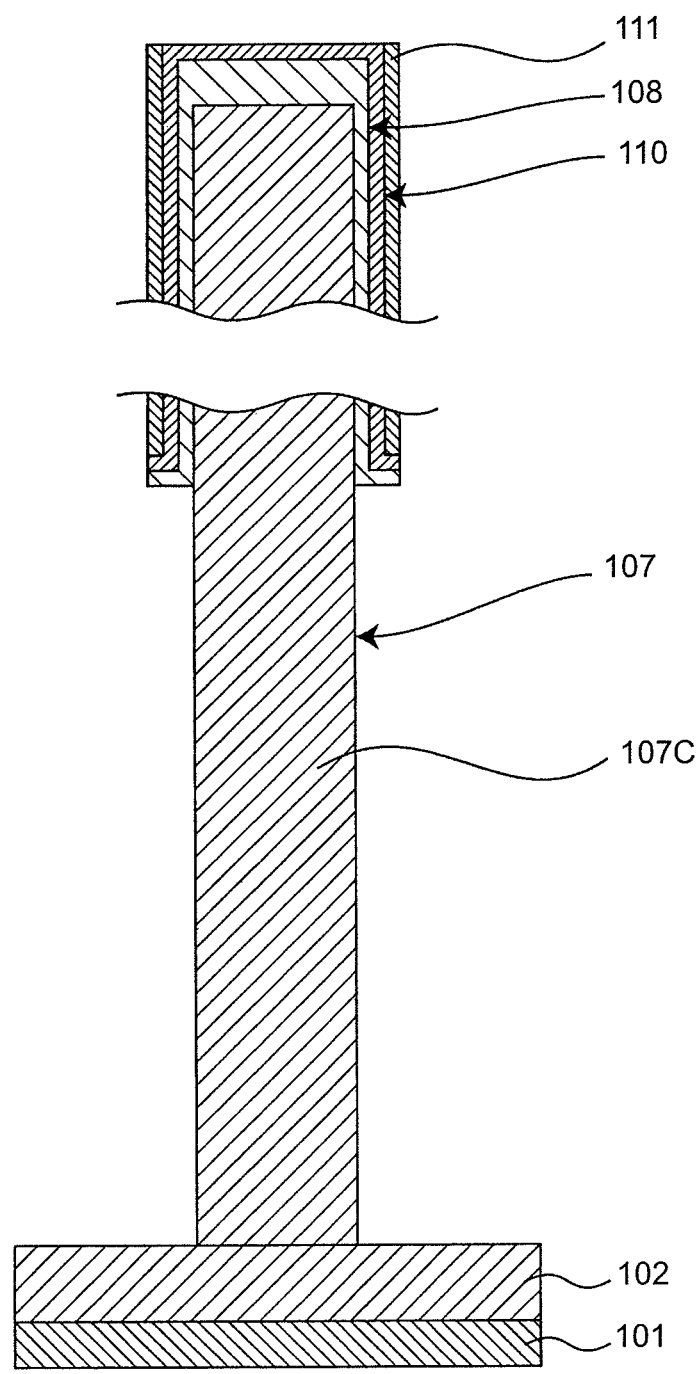
FIG. 15 is a process drawing following FIG. 14.

As shown in FIG. 15, subsequently, the mask layer 103 (shown in FIG. 14) is removed by etching. On condition that the mask layer 103 is made of silicon oxide ($SiO_2$) or silicon nitride ($Si_3N_4$), use of a solution containing hydrofluoric acid (HF) facilitates the etching of the mask layer 103 without influencing the semiconductor cores 107 and parts of the semiconductor layer 110 and the conducting film 111 that cover the semiconductor cores 107. By dry etching with use of $CF_4$, $XeF_2$ or the like, the etching can easily be performed on the mask layer 103 without influencing the semiconductor cores 107 and the parts of the semiconductor layer 110 and the conducting film 111 that cover the semiconductor cores 107. In the semiconductor cores 107, as a result, outer circumferential surfaces of exposed parts 107C thereof on side nearer to the sapphire substrate 101 are exposed.

Figure 16:
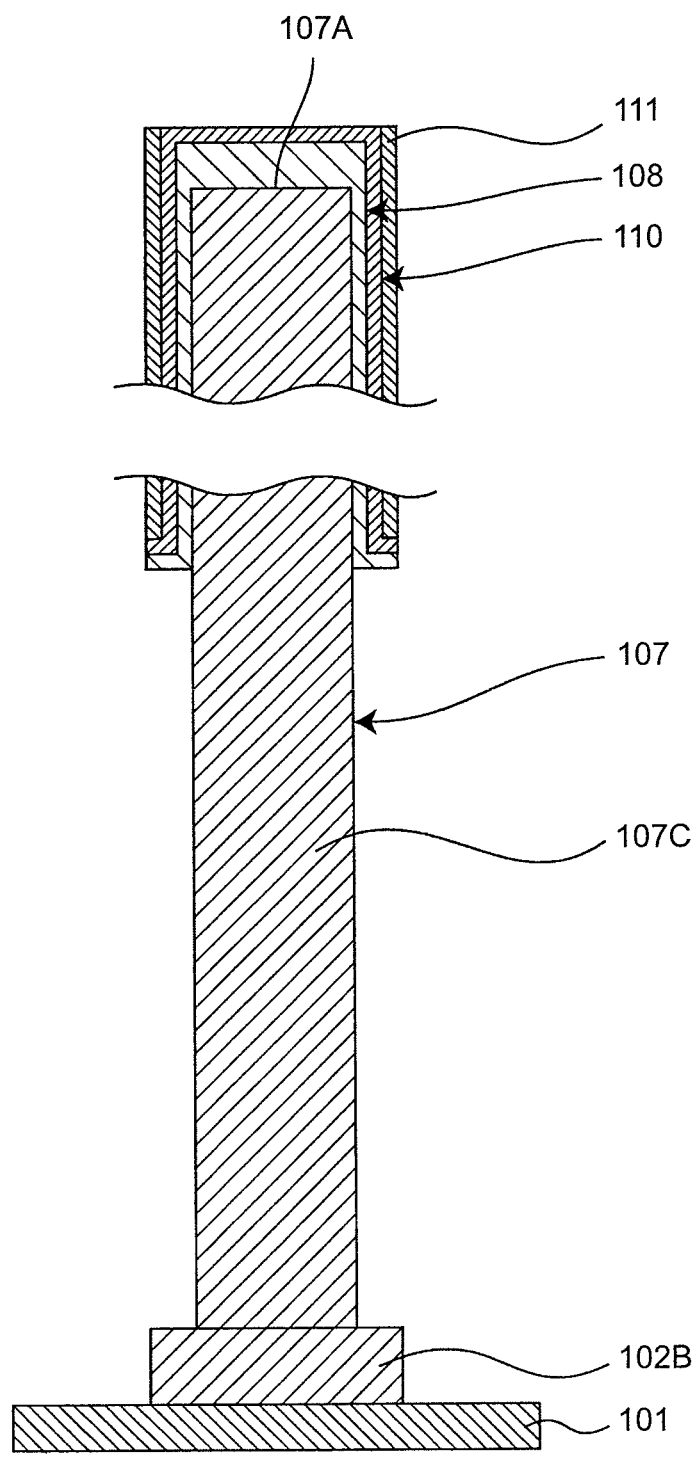
FIG. 16 is a process drawing following FIG. 15.

As shown in FIG. 16, subsequently, the base n-type GaN film 102 is etched by RIE (Reactive Ion Etching), so that the surface of the sapphire substrate 101 is exposed. Thus step parts 102B that are connected to the semiconductor cores 107 and that are made of n-type GaN are formed. The extremity surfaces 107A of the semiconductor cores 107 can be prevented from being exposed by the RIE because the thicknesses of the semiconductor layer 110 and the quantum well layer 108 on the extremity surfaces 107A are sufficiently larger than the thickness of the base n-type GaN film 102.

Thus the bar-like structured light emitting elements each composed of the semiconductor core 107 made of n-type GaN, the quantum well layer 108 made of p-type InGaN, the semiconductor layer 110 and the conducting film 111 made of p-type GaN, and the step part 102B made of n-type GaN are formed on the sapphire substrate 101.

Figure 17:
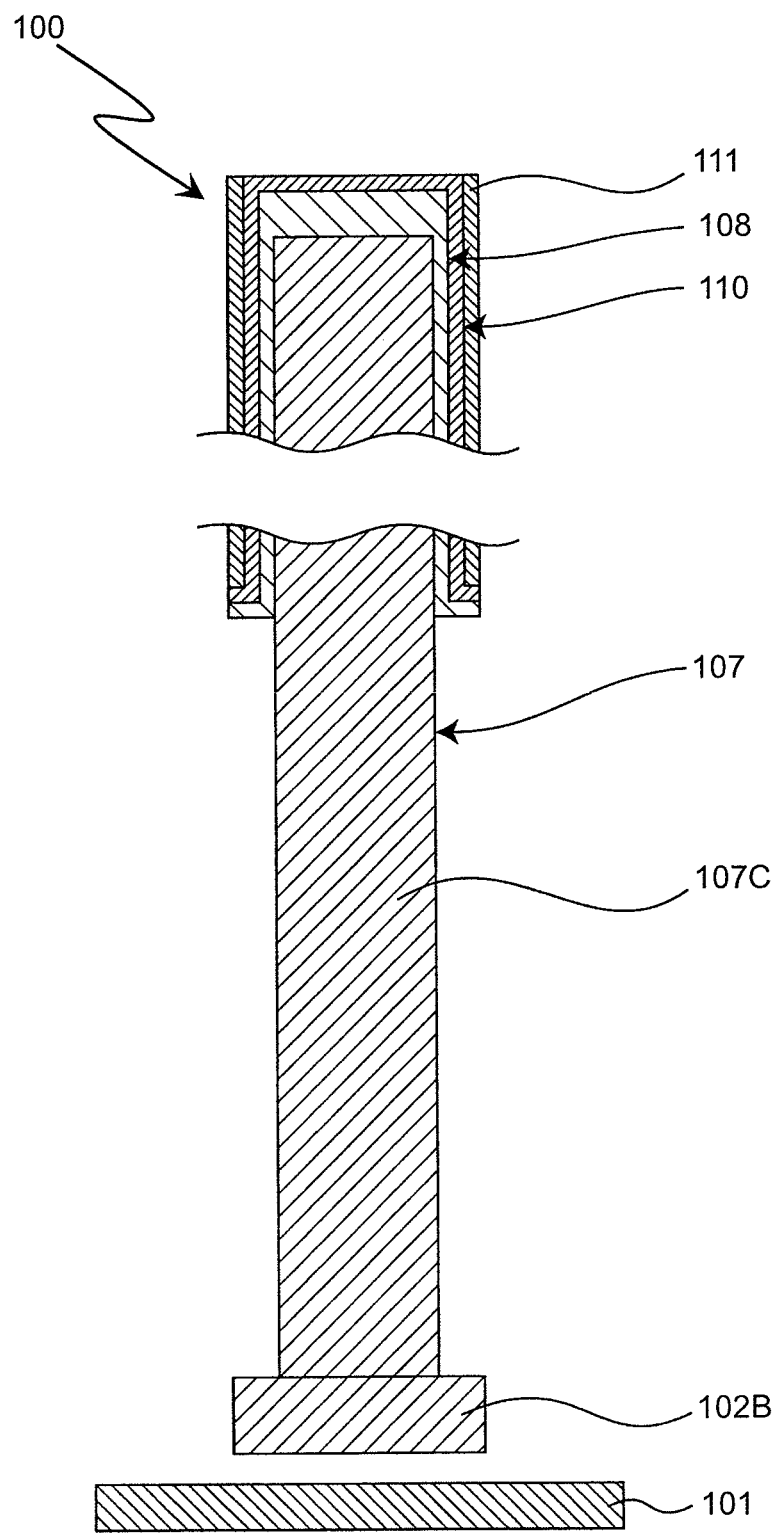
FIG. 17 is a process drawing following FIG. 16.

In a separation step, subsequently, the substrate is immersed in aqueous solution of isopropyl alcohol (IPA), the base substrate (sapphire substrate 101) is vibrated along a plane of the substrate with use of ultrasonic waves (tens of kilohertz, for instance), and stresses act on the semiconductor cores 107 covered with the quantum well layer 108, the semiconductor layer 110, and the conducting film 111 so as to fold the semiconductor cores 107 standing on the base substrate, so that the semiconductor cores 107 covered with the quantum well layer 108, the semiconductor layer 110, and the conducting film 111 are separated from the base substrate as shown in FIG. 17.

Thus the minute bar-like structured light emitting elements separated from the base substrate are manufactured.

Though the semiconductor cores 107 are separated from the substrate with use of ultrasonic waves, there is no limitation thereto and the semiconductor cores may be separated by being mechanically folded relative to the substrate with use of a cut-off tool. In this technique, the plurality of minute bar-like structured light emitting elements provided on the substrate can be separated by a simple method in a short period of time.

In the bar-like structured light emitting element, the semiconductor core 107 can be covered with the semiconductor layer 110 with little crystal defects because of the crystal growth of the semiconductor layer 110 that is outward in radial directions from the outer circumferential surface of the semiconductor core 107, short growth distance in the radial directions, and outward escape of the defects. Therefore, the bar-like structured light emitting elements having satisfactory characteristics can be provided.

By the method of manufacturing the light emitting elements, the minute bar-like structured light emitting elements 100 that have been separated from the base substrate can be manufactured. Besides, the sapphire substrate 101 is recycled. Besides, a light emitting device, a backlight, an illuminating device, a display device, and the like with high efficiency of light emission and power saving property can be provided by use of the bar-like structured light emitting elements 100 by which saving in quantity of semiconductor used therein and reduction in thicknesses and weights of devices using the light emitting elements can be attained and in which light emitting area thereof can be enlarged by emission of light from the overall circumferences of the semiconductor cores 107 covered with the semiconductor layer 110. The step parts 102B are formed by the etching of the base n-type GaN film 102 by the RIE (Reactive Ion Etching) as shown in FIG. 16, whereas bar-like structured light emitting elements having no step parts 102B may be manufactured with omission of the etching of the base n-type GaN film 102 and by separation of the semiconductor cores 107 from the base n-type GaN film 102 having no step parts 102B.

In the bar-like structured light emitting elements 100, each having a diameter of 1 µm and a length of 25 µm, the light emitting area of each bar-like structured light emitting element 100, i.e., the area of the quantum well layer 108 is generally given by $(25*\pi*(0.5)^2 \mu m^2$—(outer circumferential area of the exposed part 107C)) $(2,500\pi \mu m^2$ or less).

In the light emitting device of the second embodiment, one hundred or more bar-like structured light emitting elements 100 are placed on a mounting surface of one substrate while being dispersed uniformly in general so that longitudinal directions of the bar-like structured light emitting elements 100 shown in FIG. 17 parallel the mounting surface of the substrate (not shown).

In the light emitting device in which the plurality of bar-like structured light emitting elements 100 each having the area of the light emitting surface of $2,500\pi \mu m^2$ or less (more preferably $625\pi \mu m^2$ or less) are placed on the mounting surface of the one substrate, lateral heat outflow toward the substrate occurs in center parts also of the light emitting surfaces and thus temperatures of the light emitting elements including temperatures of the center parts of the light emitting surfaces are decreased, so that increase in the temperatures in light emission is suppressed. By the placement of one hundred or more such minute bar-like structured light emitting elements 100 on the mounting surface of the one substrate, variation in luminance in total on condition that the plurality of bar-like structured light emitting elements 100 having variation in luminance are gathered up can be decreased to not more than one-tenth of the variation in luminance of one bar-like structured light emitting element 100. There is a variation among elements in quantity of decrease in efficiency of light emission of the bar-like structured light emitting elements 100 that is caused by the increase in the temperatures thereof, whereas the setting of the area of the light emitting surface of each bar-like structured light emitting element 100 to $2,500\pi \mu m^2$ or less (more preferably $625\pi \mu m^2$ or less) suppresses the increase in the temperatures and the variation in the quantity of decrease in the efficiency of light emission, further enhancing the effect of reducing the variation in luminance that is obtained by use of the one hundred or more minute bar-like structured light emitting elements 100.

Furthermore, the microminiaturization of the bar-like structured light emitting elements 100 and the dispersive placement thereof on the mounting surface of the one substrate make it possible to reduce the light intensity by the dispersion of light projected onto the resin, while the quantity of light as much as that of one light emitting element is obtained from the plurality of minute bar-like structured light emitting elements 100, for instance, and thus the suppression of deterioration of the resin and the extension of the life thereof can be attained.

In the light emitting device, little variation in luminance, long life, and high efficiency can be fulfilled by such dispersion of light emission with the suppression of the increase in the temperatures in the light emitting operation.

Herein, the plurality of bar-like structured light emitting elements 100 are placed with generally uniform dispersion on the substrate (not shown) having an area equal to or larger than four times as large as a sum total of the light emitting areas of the plurality of bar-like structured light emitting elements 100, and thus the lateral outflow toward the substrate of heat produced in the bar-like structured light emitting elements 100 by light emission is efficiently caused, so that the suppression of the increase in the temperatures in the light emitting operation, the extension of the life, and the increase in the efficiency are further attained.

The placement of the plurality of bar-like structured light emitting elements 100 on the mounting surface of the substrate such that the longitudinal directions of the plurality of bar-like structured light emitting elements 100 are parallel to the mounting surface of the substrate (not shown) increases a ratio of a length in an axial direction (longitudinal direction) of the light emitting element to that in a radial direction thereof. This causes more efficient lateral heat outflow toward the substrate than in a configuration with square light emitting surfaces under condition that the areas of the light emitting surfaces are equal, further enhancing the suppression of the increase in the temperatures in the light emitting operation, the extension of the life, and the increase in the efficiency.

Because the bar-like structured light emitting elements 100 each have the cylindrical light emitting surface (quantum well layer 108) that concentrically surrounds the bar-like semiconductor core 107, it is possible to increase the area of the light emitting surface of each bar-like structured light emitting element 100, reduce the number of the light emitting elements required for obtaining a specified luminance, and reduce costs therefor, within a condition that the one hundred or more bar-like structured light emitting elements 100 each having the area of the light emitting surface of $2,500\pi$ $\mu m^2$ or less (preferably $625\pi$ $\mu m^2$ or less) are placed on the mounting surface of the one substrate.

The bar-like structured light emitting elements 100 that each have the p-type bar-like semiconductor core 107 and the n-type cylindrical semiconductor layer 110 which is formed so as to cover the outer periphery of the semiconductor core 107 with one end part of the semiconductor core 107 exposed facilitate interconnections because connection of one electrode to the exposed one end part 107C of the semiconductor core 107 and connection of an electrode to the semiconductor layer 110 on the other end part of the semiconductor core 107 can be attained with the electrodes connected to both the ends with spacing therebetween so that short circuit between the electrode connected to the semiconductor layer 110 and the exposed part 107C of the semiconductor core 107 is prevented.

The shape of sections of the exposed part 107C of the semiconductor core 107 and a part thereof covered with the semiconductor layer 110 is not limited to the hexagon and may be other polygons or circle, and the sections of the exposed part and the covered part of the semiconductor core may have different shapes.

In the method of manufacturing the light emitting elements in accordance with the embodiment, the p-type semiconductor layer 110 is formed not only on the extremity surfaces 107A of the n-type semiconductor cores 107 but also on the side surfaces 107B, and thus increase in area of pn junction, increase in the light emitting area, and improvement in the efficiency of light emission can be fulfilled. The n-type semiconductor cores 107 are formed with use of the catalytic metal 106, and thus the growth rate of the n-type semiconductor cores 107 can be increased. Thus the semiconductor cores 107 can be lengthened in a shorter period of time than in conventional techniques, and the light emitting area that is in proportional relation to length of the n-type semiconductor core 107 can further be increased. The extremity surfaces 107A and the side surfaces of the n-type semiconductor cores 107 are covered with the p-type semiconductor layer 110, and thus the short circuit between the electrode for the p-type semiconductor layer 110 and the n-type semiconductor core 107 can be prevented.

In the method of manufacturing the light emitting elements in accordance with the embodiment, the p-type quantum well layer 108 and the p-type semiconductor layer 110 are formed in a state in which the catalytic metal 106 is left behind, and thus the formation of the n-type semiconductor cores 107 and the formation of the p-type quantum well layer 108 and the p-type semiconductor layer 110 can successively be performed in one manufacturing apparatus. Accordingly, reduction in number of the steps and in manufacturing time can be fulfilled. There is no need to take the semiconductor cores 107 out of the manufacturing apparatus after the formation of the n-type semiconductor cores 107, and thus prevention of adherence of contamination onto the surfaces of the n-type semiconductor cores 107 and improvement in element characteristics can be attained. The formation of the n-type semiconductor cores 107 and the formation of the p-type quantum well layer 108 and the p-type semiconductor layer 110 can successively be performed, and thus crystallinity can be improved by avoidance of great change in the temperatures, stoppage of the growth, and the like, so that the element characteristics can be improved. By omission of the etching for removing the catalytic metal 106 immediately after the formation of the n-type semiconductor cores 107, damages to surfaces of the n-type semiconductor cores 107 (that is, interface with the p-type semiconductor layer 110) can be prevented, and the element characteristics can be improved.

In the embodiment, the n-type semiconductor cores 107 and the p-type semiconductor layer 110 are sequentially formed while the catalytic metal 106 remains adhering onto the sapphire substrate 101, and thus the growth rates of the parts that are in contact with the catalytic metal 106 are noticeably higher than (ten to one hundred times, for instance) the growth rates of the parts that are not in contact with the catalytic metal 106. Therefore, the light emitting elements having a high aspect ratio of dimensions can be manufactured. In the second embodiment, as an example, the bar-like structured light emitting elements 100 have the diameter of 1 μm and the length of 25 μm. The n-type semiconductor cores 107 and the p-type semiconductor layer 110 can successively be stacked under the catalytic metal 106, and thus defects in the pn junctions can be decreased.

In the manufacturing method in accordance with the embodiment, the exposed parts 107C of the semiconductor cores 107 on the side nearer to the sapphire substrate 101 are exposed by the removal of the mask layer 103, so that quantity of etching of the semiconductor layer 110 can be reduced. In the bar-like structured light emitting element 100, contact can easily be made with the semiconductor core 107 through the step part 102B that is connected to the semiconductor core 107 and that is made of n-type GaN. The bar-like structured light emitting elements 100 improve the efficiency of light emission through agency of the quantum well layer 108.

Though the n-type GaN film 102 is deposited on the sapphire substrate 101 in the embodiment, the mask layer 103 may directly be formed on the sapphire substrate 101 with omission of the step of depositing the n-type GaN film 102 on the sapphire substrate 101. The catalytic metal 106 on the semiconductor cores 107 is removed by etching in the catalytic metal removal step in the embodiment, whereas the conducting film 111 may be formed, in a state in which the catalytic metal 106 remains, with omission of the catalytic metal removal step. The conducting film 111, the semiconductor layer 110 made of p-type GaN, and the quantum well layer 108 are etched by RIE as shown in FIG. 14 in the embodiment, whereas the etching step by RIE may be omitted and the mask layer 103 may be removed by simultaneous lift-off for the layers in a subsequent step of removing the mask layer 103.

Though the MOCVD device is used to cause the crystal growth of the semiconductor cores 107 in the second embodiment, other crystal growth devices such as a MBE (molecular beam epitaxial) device may be used to form the semiconductor cores. Though the growth mask having the growth holes is used to cause the crystal growth of the semiconductor cores on the substrate, metal species may be placed on the substrate and crystal growth of the semiconductor cores from the metal species may be brought about.

Though the semiconductor cores 107 covered with the semiconductor layer 110 are separated from the sapphire substrate 101 with use of ultrasonic waves in the second embodiment, there is no limitation thereto and the semiconductor cores may be separated by being mechanically folded relative to the substrate with use of a cut-off tool. In this technique, the plurality of minute bar-like structured light emitting elements provided on the substrate can be separated by the simple method in a short period of time.

[Third Embodiment]

Figure 18:
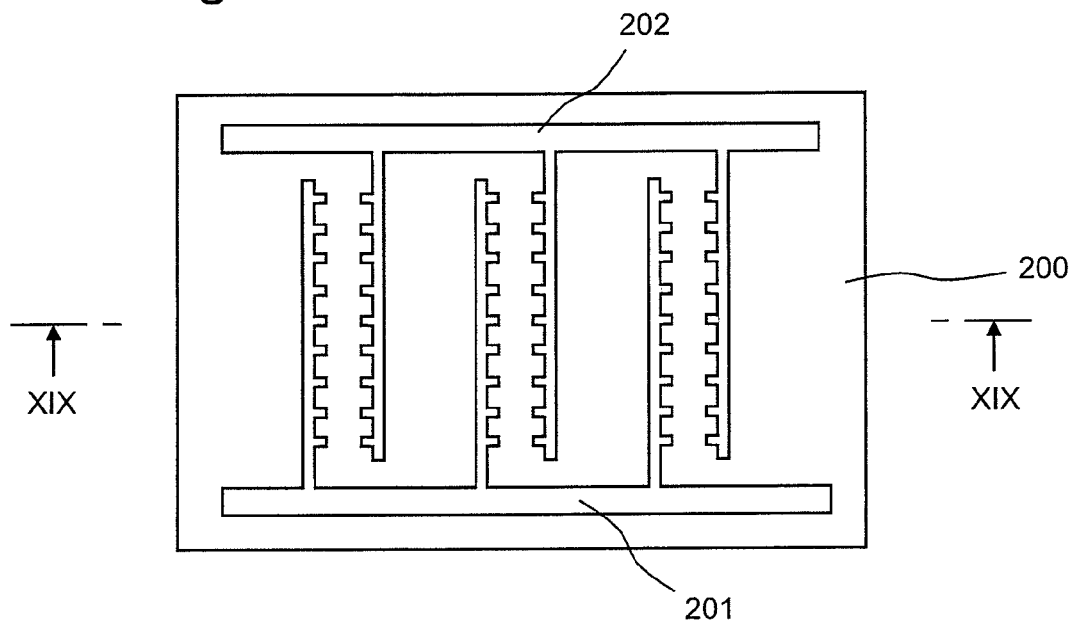
FIG. 18 is a plan view of an insulating substrate used in a light emitting device in accordance with a third embodiment of the invention.

FIG. 18 shows a plan view of an insulating substrate used in a method of manufacturing a light emitting device in accordance with a third embodiment of the invention. As bar-like structured light emitting elements used in the light emitting device in accordance with the third embodiment, the light emitting elements in accordance with the first or second embodiment or other bar-like light emitting elements may be used.

In a substrate production step for the light emitting device of the third embodiment, as shown in FIG. 18, the insulating substrate 200 on which metal electrodes 201, 202 as an example of first and second electrodes are formed on a mounting surface is initially produced. The insulating substrate 200 is a substrate in which a silicon oxide film is formed on a surface of an insulator such as glass, ceramic, aluminum oxide, and resin or semiconductor such as silicon and in which a surface thereof has insulation property. In use of the glass substrate, it is desirable to form a base insulating film such as a silicon oxide film or a silicon nitride film on the surface thereof.

The metal electrodes 201, 202 are formed into desired electrode shapes with use of a printing technique. The formation may be carried out by uniform lamination of a metal film and a photoreceptor film, exposure with use of a desired electrode pattern, and etching.

Though omitted in FIG. 18, pads are formed on the metal electrodes 201, 202 so that electric potential can be applied thereto from the exterior.

In an arraying step, subsequently, the bar-like structured light emitting elements are arrayed on parts (arraying areas) where the metal electrodes 201, 202 face each other. Though only 9×3 arraying areas where the bar-like structured light emitting elements are arrayed are shown in FIG. 18 for clarification of the drawing, a desired number not less than one hundred of the arraying areas are provided in practice.

Figure 19:
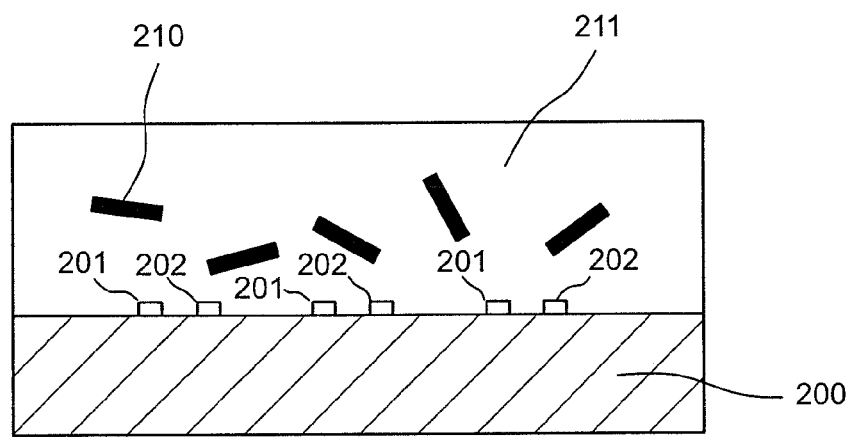
FIG. 19 is a schematic section taken along line XIX-XIX in FIG. 18.

FIG. 19 is a schematic section taken along line XIX-XIX in FIG. 18.

In an application step as shown in FIG. 19, initially, isopropyl alcohol (IPA) 211 including the bar-like structured light emitting elements 210 is thinly applied onto the insulating substrate 200. Other than IPA 211, there may be used ethylene glycol, propylene glycol, methanol, ethanol, acetone, or mixture thereof. Alternatively, liquid made of other organic matter, water or the like can be substituted for the IPA 211.

If a large current flows between the metal electrodes 201 and 202 through the liquid, it is made impossible to apply a desired voltage difference between the metal electrodes 201 and 202. In such a case, an overall surface of the insulating substrate 200 is preferably coated with an insulator film with thickness on the order of 10 nm to 30 nm so that the insulator film covers the metal electrodes 201, 202.

Thickness of the application of the IPA 211 including the bar-like structured light emitting elements 210 is a thickness that allows the bar-like structured light emitting elements 210 to move in the liquid so that the bar-like structured light emitting elements 210 can be arrayed in the subsequent step of arraying the bar-like structured light emitting elements 210. Accordingly, the thickness of the application of the IPA 211 is larger than thickness of the bar-like structured light emitting elements 210 and is between several micrometers and several millimeters, for instance. The thickness of the application that is too small makes it difficult for the bar-like structured light emitting elements 210 to move and the thickness that is too large makes it take more time to dry the liquid. Quantity of the bar-like structured light emitting elements 210 with respect to quantity of IPA is preferably between $1*10^4$ elements/cm$^3$ and $1*10^7$ elements/cm$^3$.

In order to apply the IPA 211 including the bar-like structured light emitting elements 210, frames may be formed on outer periphery of the metal electrodes on which the bar-like structured light emitting elements 210 are to be arrayed, and the IPA 211 including the bar-like structured light emitting elements 210 may be filled into the frames so as to have a desired thickness. On condition that the IPA 211 including the bar-like structured light emitting elements 210 has viscosity, however, the application with the desired thickness can be attained without necessity for the frames.

The lower the viscosity of IPA, ethylene glycol, propylene glycol, . . . , mixture thereof, liquid made of other organic matter or liquid such as water, the more desirable for the arraying step for the bar-like structured light emitting elements 210, and the liquid is preferably prone to be evaporated by being heated.

Subsequently, a potential difference is applied between the metal electrodes 201 and 202. In the third embodiment, it was appropriate to set the potential difference at 1V. The potential difference between 0.1V and 10V can be applied between the metal electrodes 201 and 202, the difference of less than 0.1V deteriorates the arraying of the bar-like structured light emitting elements 210, and the difference of more than 10V causes a problem in insulation between the metal electrodes. Therefore, the difference is preferably between 1V and 5V and is more preferably on the order of 1V.

Figure 20:
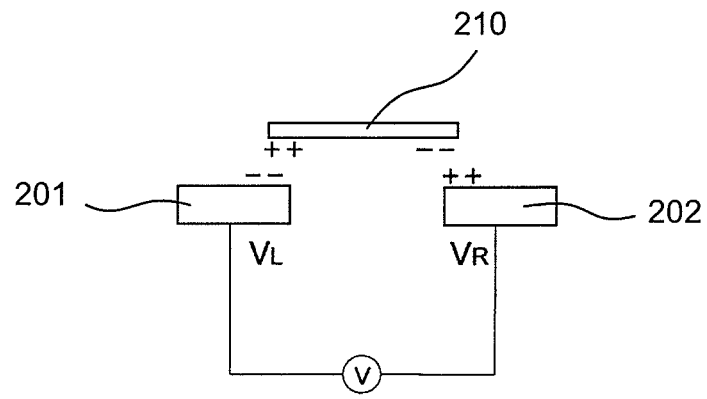
FIG. 20 is a diagram for illustrating a principle by which bar-like structured light emitting elements are arrayed.

FIG. 20 shows a principle by which the bar-like structured light emitting elements 210 are arrayed on the metal electrodes 201, 202. By application of electric potential VL to the metal electrode 201 and electric potential VR (VL<VR) to the metal electrode 202, as shown in FIG. 20, a negative charge is induced in the metal electrode 201 and a positive charge is induced in the metal electrode 202. When the bar-like structured light emitting elements 210 approach there, positive charges are induced on a side nearer to the metal electrode 201 in the bar-like structured light emitting elements 210 and negative charges are induced on a side thereof nearer to the metal electrode 202. The electric charges are induced in the bar-like structured light emitting elements 210 by electrostatic induction. That is, the electric charges are induced on surfaces of the bar-like structured light emitting elements 210 placed in an electric field until an inside electric field is made zero. As a result, attractive forces based on electrostatic forces act between the electrodes and the bar-like structured light emitting elements 210, so that the bar-like structured light emitting elements 210 are positioned along electric lines of force produced between the metal electrodes 201 and 202 and are regularly arrayed at generally uniform intervals so as to extend in a fixed direction by action of repulsive forces caused by the electric charges because the electric charges induced in the bar-like structured light emitting elements 210 are generally equal. In the bar-like structured light emitting elements shown in the second embodiment, for instance, orientations of the exposed parts of the semiconductor cores 107 covered with the semiconductor layer 110 are however made nonuniform and random.

Sizes of the bar-like structured light emitting elements 210 are required to be such that the elements are allowed to move in the liquid, because the electric charges are generated in the bar-like structured light emitting elements 210 by the external electric field generated between the metal electrodes 201 and 202 so that the bar-like structured light emitting elements 210 are attracted onto the metal electrodes 201, 202 by the attractive forces of the electric charges as described above. Accordingly, the sizes of the bar-like structured light emitting elements 210 vary with the quantity (thickness) of the application of the liquid. The bar-like structured light emitting elements 210 have to have nano order sizes when the quantity of the application of the liquid is small, while the elements may be of micro order sizes when the quantity of the application of the liquid is large.

When the bar-like structured light emitting elements 210 are not electrically neutral and positively or negatively charged, it is impossible to stably array the bar-like structured light emitting elements 210 only by the application of a static potential difference (DC) between the metal electrodes 201 and 202. When the bar-like structured light emitting elements 210 are positively charged in net, for instance, the attractive forces from the metal electrode 202 in which the positive charge is induced are made relatively weak. This results in asymmetric arrays of the bar-like structured light emitting elements 210.

Figure 21A:
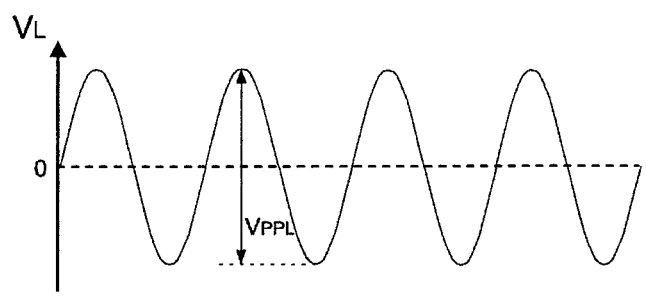
FIG. 21A is a diagram illustrating potential that is applied to an electrode when the bar-like structured light emitting elements are arrayed.
Figure 21B:
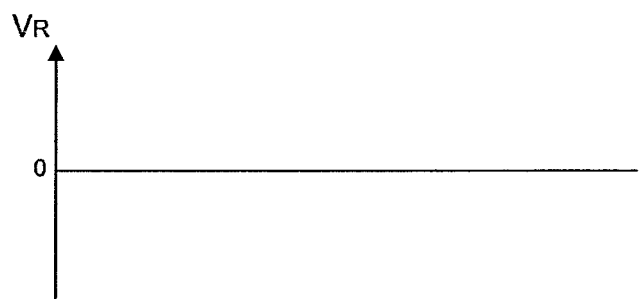
FIG. 21B is a diagram illustrating potential that is applied to an electrode when the bar-like structured light emitting elements are arrayed.

In such a case, AC voltages are preferably applied between the metal electrodes 201 and 202, as shown in FIGS. 21A and 21B. In FIGS. 21A and 21B, a reference potential is applied to the metal electrode 202 and the AC voltages with an amplitude of VPPL/2 are applied to the metal electrode 201. This makes it possible to keep the arrays symmetrical even when the bar-like structured light emitting elements 210 are electrically charged. Frequency of the AC voltages applied to the metal electrode 202 in this technique is preferably set between 10 Hz and 1 MHz, and the frequency is more preferably set between 50 Hz and 1 kHz because the arrays are thereby made most stable. The AC voltages applied between the metal electrodes 201 and 202 are not limited to those with sine waves and have only to be fluctuated periodically as in rectangular waves, triangular waves, sawtooth waves and the like. VPPL is preferably set on the order of 1V.

Subsequently, evaporation of the liquid and drying is carried out by heating of the insulating substrate 200 after arraying of the bar-like structured light emitting elements 210 on the metal electrodes 201, 202, so that the bar-like structured light emitting elements 210 are arrayed and fixed at equal intervals so as to extend along the electric lines of force between the metal electrodes 201 and 202.

Figure 22:
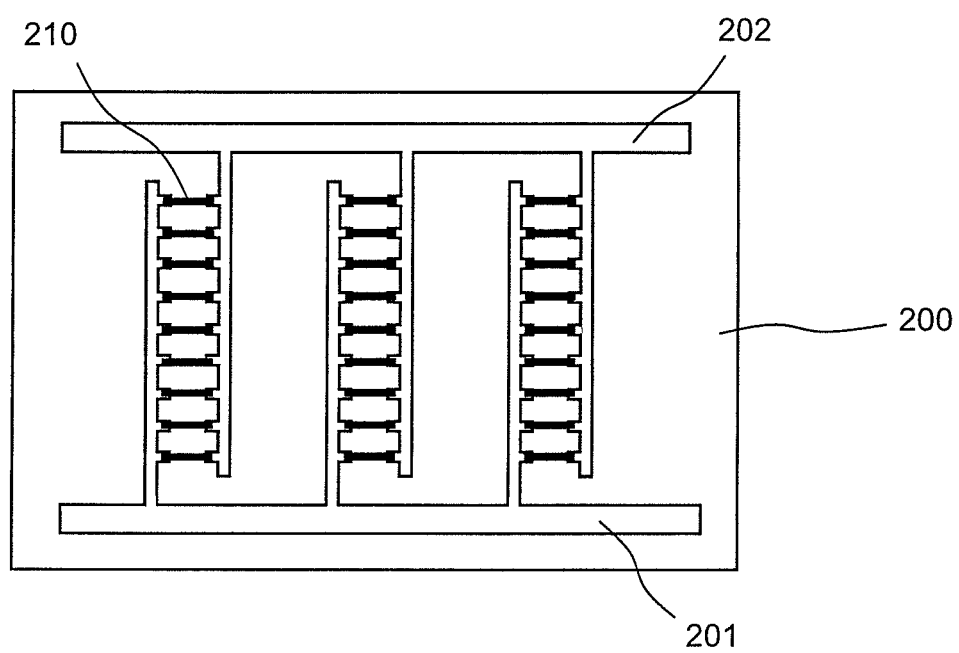
FIG. 22 is a plan view of the insulating substrate on which the bar-like structured light emitting elements are arrayed.

FIG. 22 shows a plan view of the insulating substrate 200 on which the bar-like structured light emitting elements 210 are arrayed. Though there are a decreased number of the bar-like structured light emitting elements 210 in FIG. 22 for clarification of the drawing, one hundred or more bar-like structured light emitting elements 210 are placed on the one insulating substrate 200 in practice.

Provided that the insulating substrate 200 shown in FIG. 22 and having the bar-like structured light emitting elements 210 arrayed thereon is used for a backlight for a liquid crystal display or the like, the backlight can be obtained that can be reduced in thickness and weight and that has high efficiency of light emission and power saving property. Provided that the insulating substrate 200 having the bar-like structured light emitting elements 210 arrayed thereon is used as an illuminating device, the illuminating device can be obtained that can be reduced in thickness and weight and that has high efficiency of light emission and power saving property.

Orientations of pn polarity of the bar-like structured light emitting elements 210 are not unified and are made random in the arrays. Therefore, the bar-like structured light emitting elements 210 having different polarities alternately emit light by being driven by the AC voltages.

In the method of manufacturing the light emitting device, the insulating substrate 200 having the arraying areas formed with a unit of the two metal electrodes 201, 202 to which independent electric potential is to be respectively applied is produced, and the liquid including the plurality of bar-like structured light emitting elements 210 that each have the light emitting area of $2,500\pi$ µm2 or less (more preferably not larger than $625\pi$ µm$^2$) is applied on the insulating substrate 200. After that, the independent voltages are applied to the two metal electrodes 201, 202 so as to array the minute bar-like structured light emitting elements 210 in positions defined by the two metal electrodes 201, 202. Thus the bar-like structured light emitting elements 210 can easily be arrayed on the specified insulating substrate 200.

Accordingly, it is unnecessary to place light emitting diodes one by one in specified positions on a substrate as in conventional devices, and a large number of minute light emitting diodes can accurately be placed in the specified positions.

By the method of manufacturing the light emitting device, the light emitting device can be manufactured in which little variation in luminance, long life, and high efficiency can be fulfilled by the dispersion of light emission with the suppression of the increase in the temperatures in the light emitting operation.

In the method of manufacturing the light emitting device, quantity of semiconductor that is used can be reduced. The bar-like structured light emitting elements 210 increase the light emitting areas by emission of light from the overall side surfaces of the semiconductor cores covered with the semiconductor layer, and thus the light emitting device with high efficiency of the light emission and power saving property can be provided.

In the light emitting device, the plurality of light emitting elements are placed with generally uniform dispersion on the mounting surface of the insulating substrate 200 that has an area equal to or larger than four times the sum total of the light emitting areas of the plurality of bar-like structured light emitting elements 210, and thus lateral outflow of heat produced in the light emitting elements by the light emission is efficiently caused, so that the suppression of the increase in the temperatures in the light emitting operation, the extension of the life, and the increase in the efficiency are further attained.

The placement of the bar-like structured light emitting elements 210 on the mounting surface of the insulating substrate 200 such that longitudinal directions of the plurality of bar-like structured light emitting elements 210 parallel the mounting surface of the insulating substrate 200 increases the ratio of a length thereof in an axial direction (longitudinal direction) to that in a radial direction, causes more efficient lateral heat outflow toward the insulating substrate 200 than in a configuration with square light emitting surfaces under condition that the areas of the light emitting surfaces are equal, and further enhances the suppression of the increase in the temperatures in the light emitting operation, the extension of the life and the increase in the efficiency. The method of manufacturing the light emitting device, which makes use of polarization of an object by application of voltage between electrodes, is convenient for polarization of both ends of the bar-like structured light emitting elements and is congenial to the bar-like structured light emitting elements.

As the bar-like structured light emitting elements 210, light emitting diodes each having an anode connected to the metal electrode 201 (first electrode) and a cathode connected to the metal electrode 202 (second electrode) and light emitting diodes each having a cathode connected to the metal electrode 201 (first electrode) and an anode connected to the metal electrode 202 (second electrode) are mixed and placed on the insulating substrate 200. In the light emitting device, the plurality of light emitting diodes are driven by an AC power supply applying AC voltages between the metal electrode 201 (first electrode) and the metal electrode 202 (second electrode), and thus the steps can be simplified because it is unnecessary to place the large number of light emitting diodes with unification of orientations of the anodes and the cathodes thereof.

Besides, an interconnection step can be simplified and costs can be reduced by use of at least the metal electrode 201 (first electrode) and the metal electrode 202 (second electrode) as electrodes for driving the plurality of bar-like structured light emitting elements 210.

The bar-like structured light emitting elements are used in the method of manufacturing the light emitting device in accordance with the third embodiment, whereas the light emitting elements are not limited thereto and may be light emitting elements that have flat light emitting surfaces in shape of circles, ellipses, squares, rectangles, polygons or the like and that are placed on the mounting surface so that the light emitting surfaces parallel the substrate. Bar-like light emitting elements convenient for the polarization, however, are desirable because the method of manufacturing the light emitting device in accordance with the third embodiment makes use of the polarization of an object by application of voltage between electrodes.

[Fourth Embodiment]

Figure 23:
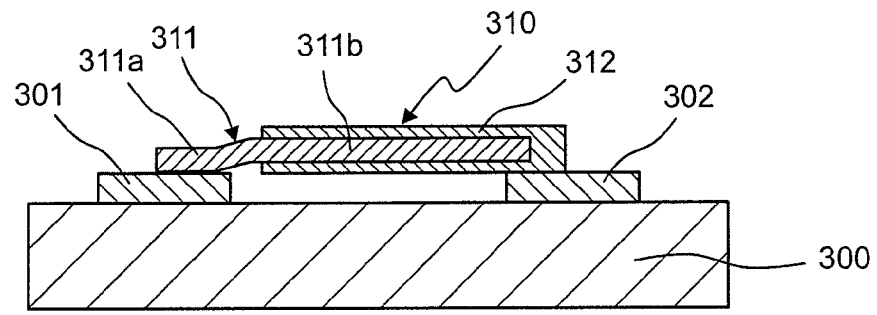
FIG. 23 is a process drawing of a method of manufacturing a light emitting device in accordance with a fourth embodiment of the invention.
Figure 24:
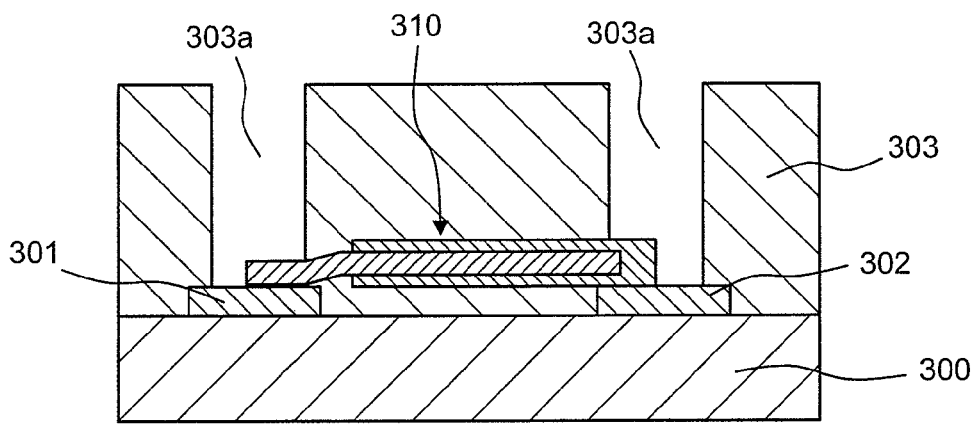
FIG. 24 is a process drawing following FIG. 23.
Figure 25:
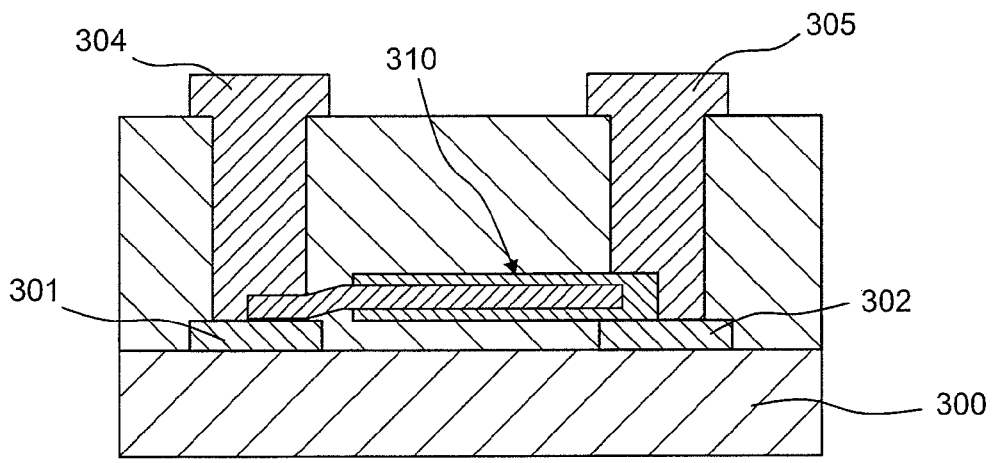
FIG. 25 is a process drawing following FIG. 24.

FIGS. 23 through 25 show process drawings of a method of manufacturing a light emitting device in accordance with a fourth embodiment of the invention.

In the method of manufacturing the light emitting device in accordance with the fourth embodiment, one hundred or more bar-like structured light emitting elements such as the second embodiment are placed on a mounting surface of one substrate. The bar-like structured light emitting elements used for the method of manufacturing the light emitting device each have only to have a first conductive type bar-like semiconductor core and a second conductive type cylindrical semiconductor layer that is formed so as to cover outer periphery of the semiconductor core, and one end part of the semiconductor core of each bar-like light emitting element has only to be exposed.

In the method of manufacturing the light emitting device in accordance with the fourth embodiment, as shown in FIG. 23, an insulating substrate 300 on which metal electrodes 301, 302 as an example of first and second electrodes are formed on a mounting surface is initially produced in a substrate production step.

In an arraying step, subsequently, one hundred or more bar-like structured light emitting elements 310 are placed on the insulating substrate 300 so that longitudinal directions thereof parallel the mounting surface of the insulating substrate 300. In the arraying step, the bar-like structured light emitting elements 310 in liquid are arrayed on the metal electrodes 301, 302 with use of a method similar to the method of manufacturing the light emitting device in accordance with the third embodiment, and evaporation of the liquid and drying are thereafter carried out by heating of the insulating substrate 300, so that the bar-like structured light emitting elements 310 are arrayed and fixed at equal intervals so as to extend along electric lines of force between the metal electrodes 301 and 302.

The light emitting elements 310 with the bar-like structure each include a semiconductor core 311 that is made of n-type GaN shaped like a bar and a semiconductor layer 312 that is made of p-type GaN and that covers a covered part 311b of the semiconductor core 311 except an exposed part 311a so as not to cover the part of the semiconductor core 311 on one end part to make the part the exposed part 311a. The exposed one end part 311a of the bar-like structured light emitting element 310 is connected to the metal electrode 301, and the semiconductor layer 312 of the other end part of the bar-like structured light emitting element 310 is connected to the metal electrode 302.

As shown in FIG. 24, subsequently, an interlayer insulating film 303 is formed on the insulating substrate 300, and contact holes 303a are formed on the metal electrodes 301 and 302 by patterning of the interlayer insulating film 303.

As shown in FIG. 25, subsequently, metal interconnections 304, 305 are formed so as to plug the two contact holes 303a.

Thus the one hundred or more bar-like structured light emitting elements 310 placed on the mounting surface of the insulating substrate 300 can collectively be placed, and the metal interconnections can collectively be connected to the plurality of bar-like structured light emitting elements 310. Light emitting area of each bar-like structured light emitting element 310 is $2,500\pi \, \mu m^2$ or less (more preferably $625\pi \, \mu m^2$ or less). Center part of the bar-like structured light emitting element 310 is shown so as to float above the insulating substrate 300 in FIGS. 23 through 25, whereas the center part of the bar-like structured light emitting element 310 is flexed and brought into contact with the insulating substrate 300, in practice, by stiction that occurs when droplets in a gap between the surface of the insulating substrate 300 and the bar-like structured light emitting element 310 contract by being evaporated in the drying of IPA aqueous solution in the method of arraying the bar-like structured light emitting elements in accordance with the third embodiment. Even if the bar-like structured light emitting elements 310 are not brought into direct contact with the insulating substrate 300, the elements 310 are brought into contact with the insulating substrate 300 through the interlayer insulating film 303.

A metal member may be provided between the center part of the bar-like structured light emitting elements 310 and the insulating substrate 300 so as to support the bar-like structured light emitting element 310, so that the center part of the bar-like structured light emitting element 310 may be in contact with the insulating substrate 300 through the metal member.

In the method of manufacturing the light emitting device, it is unnecessary to place light emitting diodes one by one in specified positions on a substrate as in conventional devices, a large number of minute light emitting diodes can accurately be placed in the specified positions, and the light emitting device can be manufactured in which little variation in luminance, long life, and high efficiency can be fulfilled by the dispersion of light emission with the suppression of the increase in the temperatures in the light emitting operation.

In the light emitting device, the plurality of bar-like structured light emitting elements 310 are placed with generally uniform dispersion on the mounting surface of the insulating substrate 300 that has an area equal to or larger than four times the sum total of the light emitting areas of the plurality of bar-like structured light emitting elements 310, and thus lateral outflow toward the substrate of heat produced in the light emitting elements by light emission is efficiently caused, so that the suppression of the increase in the temperatures in the light emitting operation, the extension of the life and the increase in the efficiency are further attained.

The placement of the bar-like structured light emitting elements 310 on the mounting surface of the insulating substrate 300 such that the longitudinal directions of the plurality of bar-like structured light emitting elements 310 parallel the mounting surface of the insulating substrate 300 increases the ratio of a length thereof in an axial direction (longitudinal direction) to that in a radial direction, causes more efficient lateral heat outflow toward the insulating substrate 300 than in a configuration with square light emitting surfaces under condition that the areas of the light emitting surfaces are equal, and further enhances the suppression of the increase in the temperatures in the light emitting operation, the extension of the life and the increase in the efficiency. The method of manufacturing the light emitting device, which makes use of polarization of an object by application of voltage between electrodes, is convenient for polarization of both ends of the bar-like structured light emitting elements and is congenial to the bar-like structured light emitting elements.

As the plurality of bar-like structured light emitting elements 310, light emitting diodes each having the exposed part 311a as anode and the covered part 311b as cathode and each having the anode connected to the metal electrode 301 (first electrode) and the cathode connected to the metal electrode 302 (second electrode) and light emitting diodes each having cathode connected to the metal electrode 301 (first electrode) and anode connected to the metal electrode 302 (second electrode) are mixed and placed on the insulating substrate 300. In the light emitting device, the plurality of light emitting diodes are driven by an AC power supply applying AC voltages between the metal electrode 301 (first electrode) and the metal electrode 302 (second electrode), and thus the manufacturing process steps can be simplified because it is unnecessary to place the large number of light emitting diodes with unification of orientations of the anodes and the cathodes thereof.

The bar-like structured light emitting elements 310 each having the cylindrical light emitting surface that concentrically surrounds the bar-like semiconductor core 311 increase the area of the light emitting surface of each bar-like structured light emitting element 310, reduces number of the light emitting elements required for obtaining a specified luminance, and reduces costs therefor, within a condition that the one hundred or more bar-like structured light emitting elements 310 each having the area of the light emitting surface of 2,500π μm² or less (more preferably 625π μm² or less) are placed on the mounting surface of the one insulating substrate 300.

The bar-like structured light emitting elements 310 that each have the p-type bar-like semiconductor core 311 and the n-type cylindrical semiconductor layer 312 which is formed so as to cover the outer periphery of the semiconductor core 311 with one end part of the semiconductor core 311 exposed facilitate interconnections because connection of one electrode to the exposed one end part 311a of the semiconductor core 311 and connection of an electrode to the semiconductor layer 312 on the other end part of the semiconductor core 311 can be attained with the electrodes connected to both the ends with spacing therebetween so that short circuit between the electrode connected to the semiconductor layer 312 and the exposed part 311a of the semiconductor core 311 is prevented.

[Fifth Embodiment]

Figure 29:
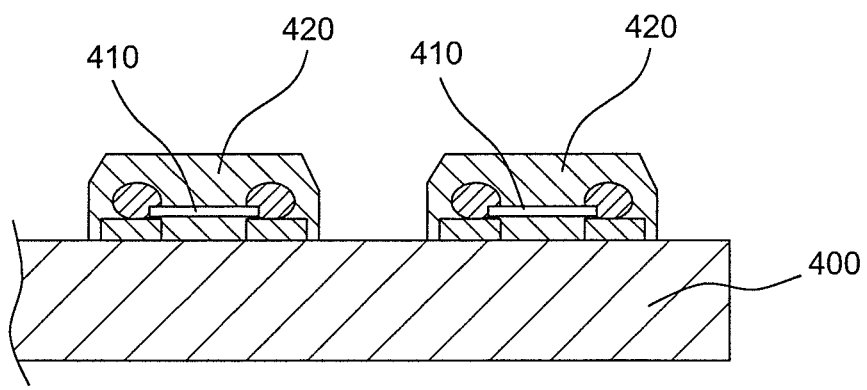
FIG. 29 is a process drawing following FIG. 28.
Figure 30:
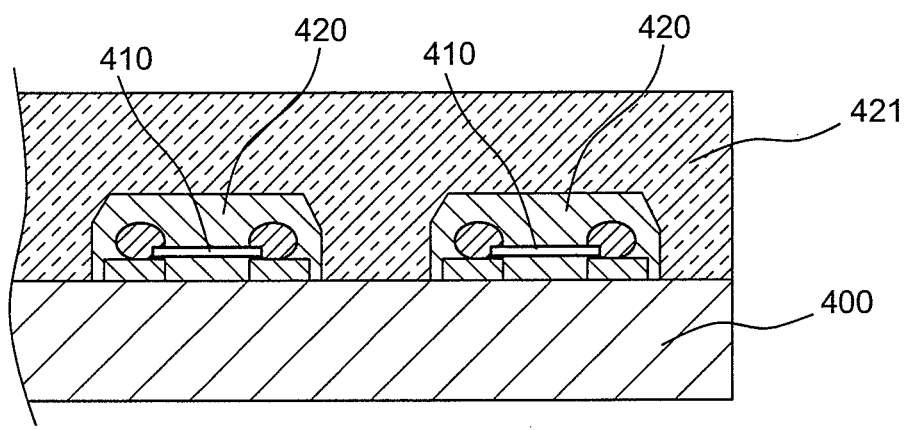
FIG. 30 is a process drawing following FIG. 29.
Figure 31:
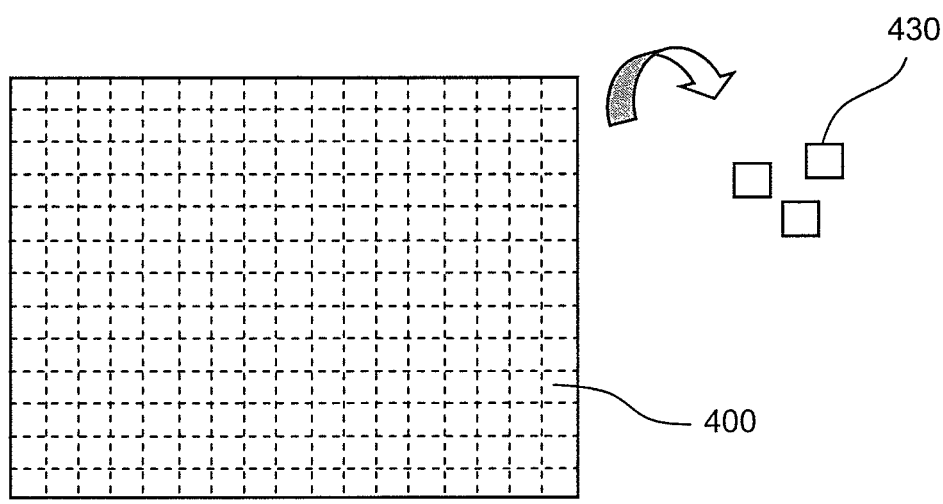
FIG. 31 is a process drawing following FIG. 30.

FIGS. 26 through 31 show process drawings of a method of manufacturing a light emitting device in accordance with a fifth embodiment of the invention. FIGS. 26 through 30 show only a portion of the light emitting device, while FIG. 31 shows the whole of the light emitting device.

In the method of manufacturing the light emitting device in accordance with the fifth embodiment, one hundred or more bar-like structured light emitting elements such as those of the second embodiment are placed on a mounting surface of one substrate. The bar-like structured light emitting elements used for the method of manufacturing the light emitting device each have only to have a first conductive type bar-like semiconductor core and a second conductive type cylindrical semiconductor layer that is formed so as to cover outer periphery of the semiconductor core, and one end part of the semiconductor core of the bar-like light emitting element has only to be exposed.

Figure 26:
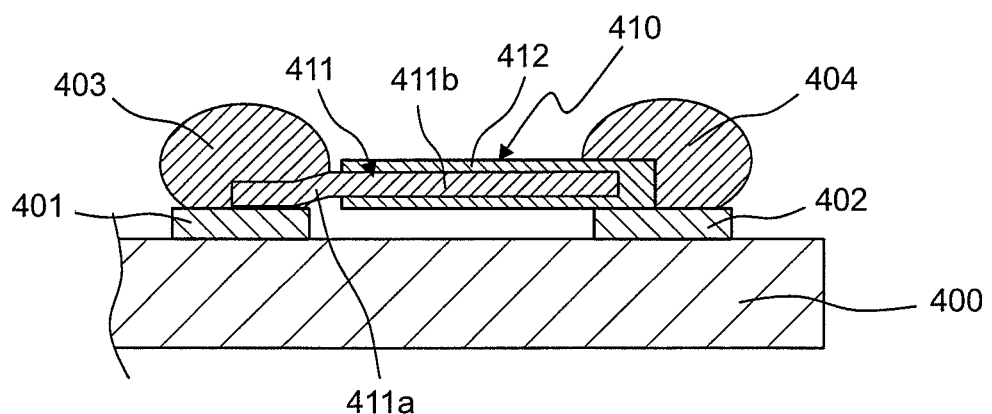
FIG. 26 is a process drawing of a method of manufacturing a light emitting device in accordance with a fifth embodiment of the invention.
Figure 27:
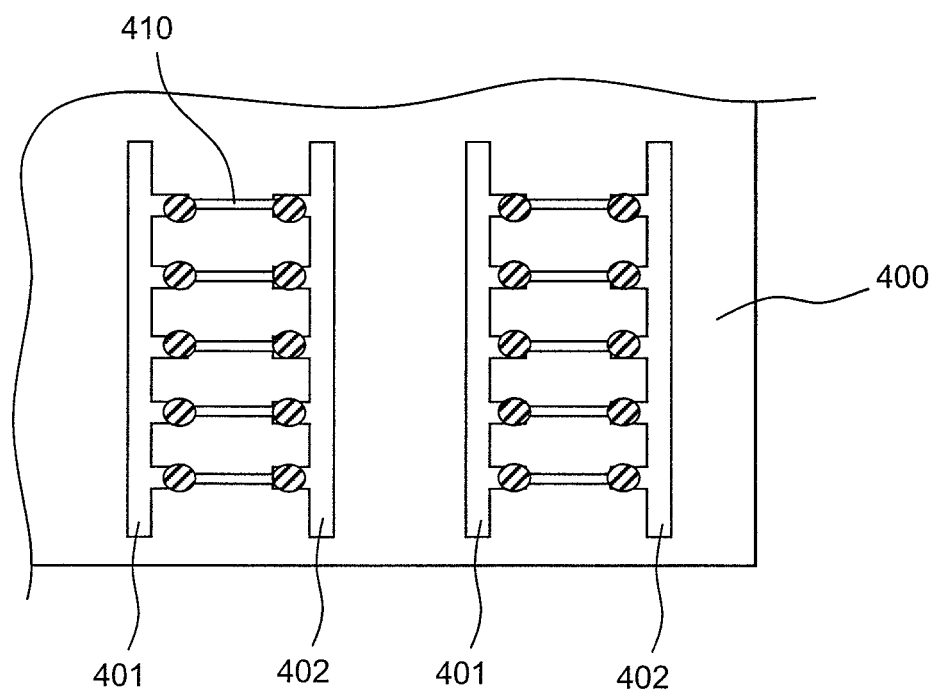
FIG. 27 is a process drawing following FIG. 26.

In the method of manufacturing the light emitting device in accordance with the fifth embodiment, as shown in a sectional view of FIG. 26 and a plan view of FIG. 27, the insulating substrate 400 on which metal electrodes 401, 402 as an example of first and second electrodes are formed on the mounting surface is initially produced in a substrate production step.

In an arraying step, subsequently, the plurality of bar-like structured light emitting elements 410 are placed on the insulating substrate 400 so that longitudinal directions thereof parallel the mounting surface of the insulating substrate 400. In the arraying step, the bar-like structured light emitting elements 410 in liquid are arrayed on the metal electrodes 401, 402 with use of a method similar to the method of manufacturing the light emitting device in accordance with the third embodiment, and evaporation of the liquid and drying are thereafter carried out by heating of the insulating substrate 400, so that the bar-like structured light emitting elements 410 are arrayed at equal intervals so as to extend along electric lines of force between the metal electrodes 401 and 402.

The light emitting elements 410 with the bar-like structure each include the semiconductor core 411 that is made of n-type GaN shaped like a bar and the semiconductor layer 412 that is made of p-type GaN and that covers a covered part 411b of the semiconductor core 411 except an exposed part 411a so as not to cover the part of the semiconductor core 411 on the one end part to make the part the exposed part 411a. The exposed part 411a at the one end part of the bar-like structured light emitting element 410 is connected to the metal electrode 401 by a bonding part 403 made of metal ink such as conductive adhesive, and the semiconductor layer 412 at the other end part of the bar-like structured light emitting element 410 is connected to the metal electrode 402 by a bonding part 404 made of metal ink such as conductive adhesive. The metal ink is applied onto specified sites on the insulating substrate 400 by ink jet method or the like.

Figure 28:
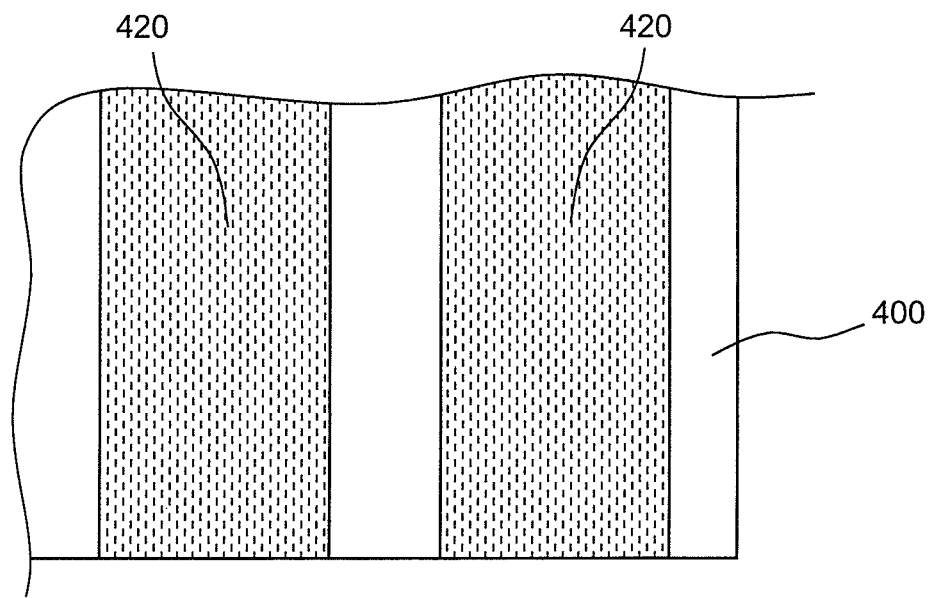
FIG. 28 is a process drawing following FIG. 27.

As shown in a plan view of FIG. 28 and a sectional view of FIG. 29, subsequently, fluorescent substance 420 is selectively applied onto areas on the insulating substrate 400 where the plurality of bar-like structured light emitting elements 410 are placed (fluorescent substance application step). The fluorescent substance is applied onto the specified areas on the insulating substrate 400 by the ink jet method or the like. Transparent resin containing fluorescent substance may selectively be applied onto the areas on the insulating substrate 400 where the plurality of bar-like structured light emitting elements 410 are placed.

As shown in FIG. 30, subsequently, a protective film 421 made of transparent resin is formed on the insulating substrate 400 after the application of the fluorescent substance 420.

Thus the plurality of bar-like structured light emitting elements 410s can collectively be placed on the mounting surface of the insulating substrate 400, and metal interconnections can collectively be connected to the plurality of bar-like structured light emitting elements 410.

In a substrate division step, as shown in a plan view of FIG. 31, the insulating substrate 400 is divided into a plurality of divided substrates 430. Each of the plurality of divided substrates 430 is a light emitting device of the invention and is divided from the insulating substrate 400 so as to include one hundred or more bar-like structured light emitting elements 410.

In the substrate division step, the insulating substrate 400 may be divided into at least two or more types of divided substrates different in shape.

In the method of manufacturing the light emitting device, light emitting area of each bar-like structured light emitting element 410 is $2,500\pi\ \mu m^2$ or less (more preferably $625\pi\ \mu m^2$ or less). Center part of the bar-like structured light emitting element 410 is shown so as to float above the insulating substrate 400 in FIGS. 26, 29 and 30, whereas the center part of the bar-like structured light emitting element 410 is flexed and brought into contact with the insulating substrate 400, in practice, by stiction that occurs when droplets in a gap between the surface of the insulating substrate 400 and the bar-like structured light emitting element 410 contract by being evaporated in the drying of IPA aqueous solution in the method of arraying the bar-like structured light emitting elements in accordance with the third embodiment.

A metal member may be provided between the center part of the bar-like structured light emitting elements 410 and the insulating substrate 400 so as to support the bar-like structured light emitting element 410, so that the center part of the bar-like structured light emitting element 410 may be in contact with the insulating substrate 400 through the metal member.

In the method of manufacturing the light emitting device, it is unnecessary to place the light emitting elements one by one in the specified positions on the substrate as in conventional devices, the large number of minute light emitting elements can accurately be placed in the specified positions, and the light emitting device can be manufactured in which little variation in luminance, long life, and high efficiency can be fulfilled by the dispersion of light emission with the suppression of the increase in the temperatures in the light emitting operation.

In the light emitting device, the plurality of bar-like structured light emitting elements 410 are placed with generally uniform dispersion on the mounting surface of the insulating substrate 400 that has an area equal to or larger than four times the sum total of the light emitting areas of the plurality of bar-like structured light emitting elements 410, and thus lateral outflow toward the substrate of heat produced in the bar-like structured light emitting elements 410 by light emission is efficiently caused, so that the suppression of the increase in the temperatures in the light emitting operation, the extension of the life and the increase in the efficiency are further attained.

The placement of the bar-like structured light emitting elements 410 on the mounting surface of the insulating substrate 400 such that the longitudinal directions of the plurality of bar-like structured light emitting elements 410 parallel the mounting surface of the insulating substrate 400 increases the ratio of a length thereof in an axial direction (longitudinal direction) to that in a radial direction, causes more efficient lateral heat outflow toward the substrate than in a configuration with square light emitting surfaces under condition that the areas of the light emitting surfaces are equal, and further enhances the suppression of the increase in the temperatures in the light emitting operation, the extension of the life and the increase in the efficiency. The method of manufacturing the light emitting device, which makes use of polarization of an object by application of voltage between electrodes, is convenient for polarization of both ends of the bar-like structured light emitting elements and is congenial to the bar-like structured light emitting elements.

As the bar-like structured light emitting elements 410, light emitting diodes each having the exposed part 411a as anode and the covered part 411b as cathode and each having the anode connected to the metal electrode 401 (first electrode) and the cathode connected to the metal electrode 402 (second electrode) and light emitting diodes each having a cathode connected to the metal electrode 401 (first electrode) and an anode connected to the metal electrode 402 (second electrode) are mixed and placed on the insulating substrate 400. In the light emitting device, the plurality of light emitting diodes are driven by an AC power supply applying AC voltages between the metal electrode 401 (first electrode) and the metal electrode 402 (second electrode), and thus the manufacturing process steps can be simplified because it is unnecessary to place the large number of light emitting diodes with unification of orientations of the anodes and the cathodes thereof.

In the method of manufacturing the light emitting device, the number of the substrates flowing in each step can be decreased and costs can substantially be reduced by the division of the insulating substrate 400 into the plurality of divided substrates 430 each having one hundred or more bar-like structured light emitting elements 410 placed thereon in the substrate division step after the arraying step in which the plurality of bar-like structured light emitting elements 410 are arrayed on the insulating substrate 400.

Cost reduction through decrease in used amount of the fluorescent substance of which material cost makes up a large percentage of total material cost can be attained by the selective application of the fluorescent substance 420 onto the areas on the insulating substrate 400 where the plurality of bar-like structured light emitting elements 410 are placed after the arraying of the plurality of bar-like structured light emitting elements 410 on the insulating substrate 400.

The bar-like structured light emitting elements 410 each having the cylindrical light emitting surface that concentrically surrounds the bar-like semiconductor core 411 increase the area of the light emitting surface of each bar-like structured light emitting element 410, reduces number of the light emitting elements required for obtaining a specified luminance, and reduces costs therefor, within a condition that the one hundred or more bar-like structured light emitting elements 410 each having the area of the light emitting surface of $2,500\pi\ \mu m^2$ or less (more preferably $625\pi\ \mu m^2$ or less) are placed on the mounting surface of the one insulating substrate 400.

[Sixth Embodiment]

Figure 32:
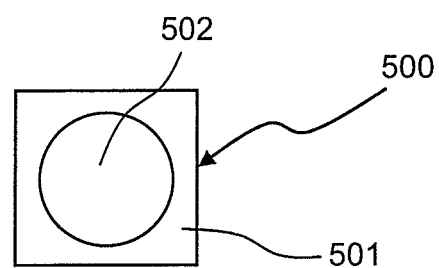
FIG. 32 is a plan view of a light emitting device that is used for an illuminating device in accordance with a sixth embodiment of the invention.
Figure 33:
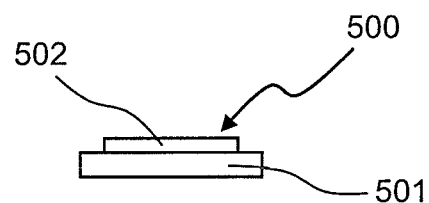
FIG. 33 is a side view of the light emitting device.

FIG. 32 shows a plan view of a light emitting device that is used for an illuminating device in accordance with a sixth embodiment of the invention, and FIG. 33 shows a side view of the light emitting device.

In the light emitting device 500 that is used for the illuminating device in accordance with the sixth embodiment, as shown in FIGS. 32 and 33, a circular insulating substrate 502 on which one hundred or more bar-like structured light emitting elements (not shown) are placed is mounted on a square radiator plate 501. The circular insulating substrate 502 is a divided substrate which is manufactured with use of the method of manufacturing the light emitting device in accordance with the fifth embodiment and on which one hundred or more bar-like structured light emitting elements are placed.

Figure 34:
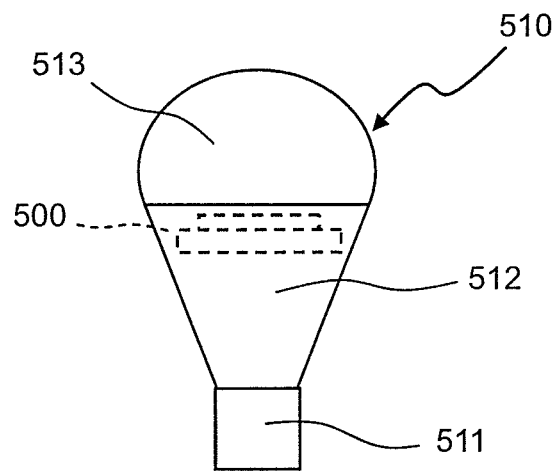
FIG. 34 is a side view of an LED bulb as an example of the illuminating device using the light emitting device.

FIG. 34 shows a side view of an LED bulb 510 as an example of the illuminating device using the light emitting device 500 shown in FIGS. 32 and 33. As shown in FIG. 34, the LED bulb 510 includes a base 511 as a power connection part that is to be connected to a commercial power supply by being fitted in an external socket, a conical radiation part 512 having one end connected to the base 511 and the other end gradually increasing in diameter, and a translucent part 513 covering the other end of the radiation part 512. The light emitting device 500 is placed in the radiation part 512 with the insulating substrate 502 facing the translucent part 513.

According to the illuminating device having the above configuration, the illuminating device can be provided in which little variation in luminance, long life, and high efficiency can be fulfilled by use of the light emitting device 500 shown in FIG. 32 and FIG. 33.

Heat radiation effect is further improved by mounting on the radiator plate 501 of the insulating substrate 502 on which the plurality of bar-like structured light emitting elements are placed.

[Seventh Embodiment]

Figure 35:
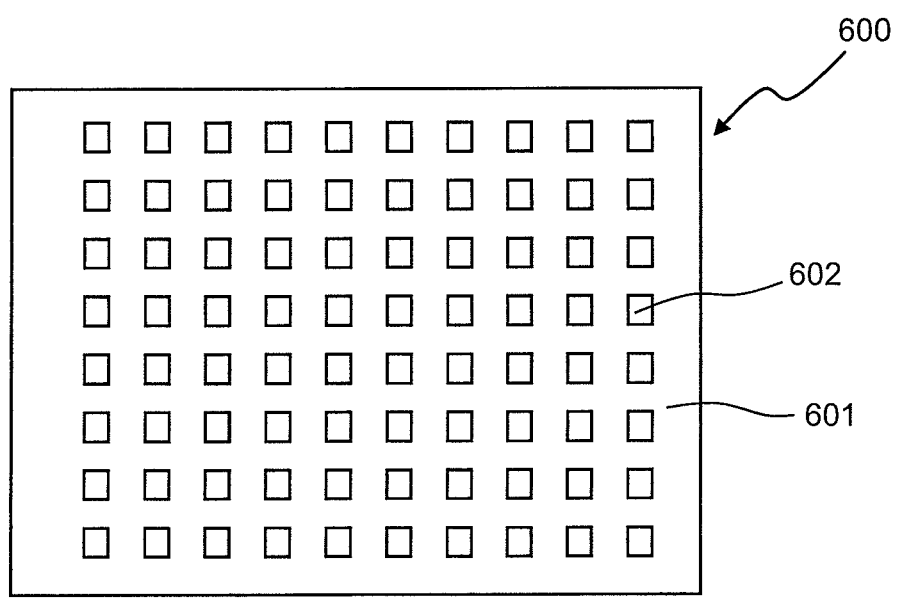
FIG. 35 is a plan view of a backlight using light emitting devices in accordance with a seventh embodiment of the invention.
Figure 36:
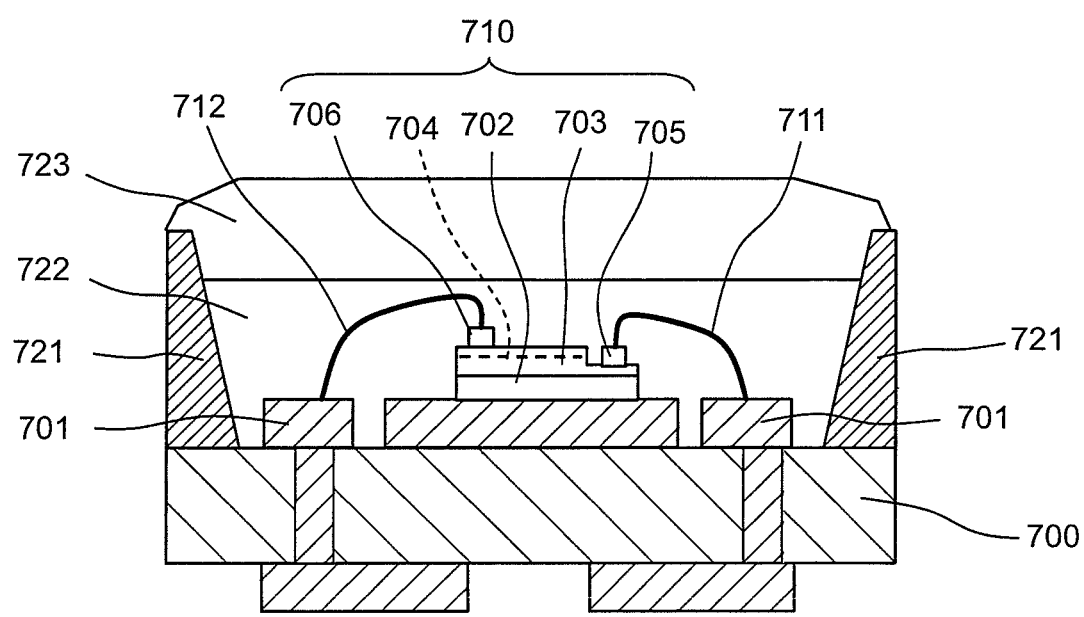
FIG. 36 is a sectional view of a conventional light emitting device.
Figure 37:
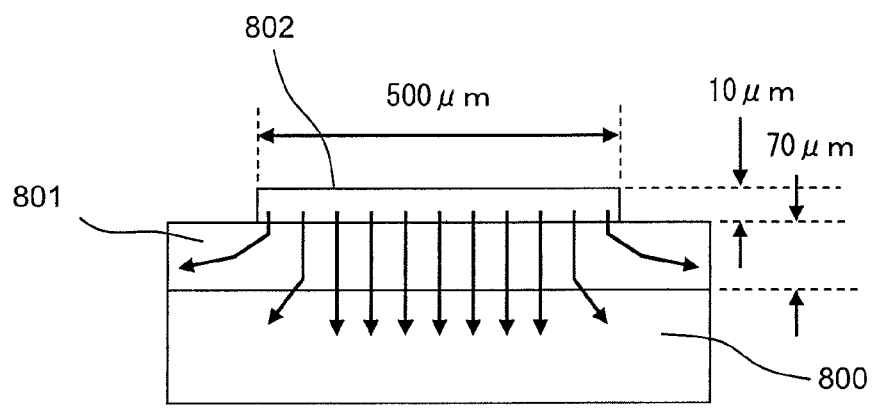
FIG. 37 is a schematic section for illustrating heat outflow in a conventional light emitting device.

FIG. 35 shows a plan view of a backlight using light emitting devices in accordance with a seventh embodiment of the invention.

In the backlight 600 of the seventh embodiment, as shown in FIG. 35, the plurality of light emitting devices 602 are mounted at specified intervals so as to form a grid on a rectangular support substrate 601 as an example of radiator plate. The light emitting devices 602 are divided substrates which are manufactured with use of the method of manufacturing the light emitting device in accordance with the fifth embodiment and on each of which one hundred or more bar-like structured light emitting elements are placed.

In accordance with the backlight having the above configuration, the backlight can be provided in which little variation in luminance, long life, and high efficiency can be fulfilled by use of the light emitting devices 602.

The heat radiation effect is further improved by mounting of the light emitting devices 602 on the support substrate 601.

Though the light emitting devices, the methods of manufacturing the light emitting devices, the illuminating device, and the backlight in which light emitting diodes are used as the light emitting elements have been described as the first through seventh embodiments, the light emitting elements of the invention are not limited to light emitting diodes and the invention may be applied to light emitting devices, methods of manufacturing the light emitting devices, illuminating devices, and backlights in which light emitting elements such as semiconductor laser, organic EL (Electro Luminescence), and inorganic EL (intrinsic EL) are used.

Though semiconductor containing GaN as base material is used for the semiconductor cores and the semiconductor layers in the second embodiment, the invention may be applied to light emitting elements in which semiconductor containing GaAs, AlGaAs, GaAsP, InGaN, AlGaN, GaP, ZnSe, AlGaInP or the like as base material is used. The semiconductor cores are of n-type and the semiconductor layers are of p-type, whereas the invention may be applied to bar-like structured light emitting elements opposite in conductivity type. The bar-like structured light emitting elements having the bar-like semiconductor cores with hexagonal sections have been described, whereas the elements are not limited thereto and may be those shaped like bars with a circular or elliptical section and the invention may be applied to bar-like structured light emitting elements having bar-like semiconductor cores with sections having other polygonal shapes.

The bar-like structured light emitting elements have the diameter of 1 µm and the length of 10 to 30 µm, i.e., those of micro order sizes in the second embodiment, whereas at least the diameter out of the diameter and the length of the elements may be smaller than 1 µm, i.e., of nano order size and the light emitting area has only to be $2,500\pi$ µm$^2$ or less (more preferably $625\pi$ µm$^2$ or less). The diameters of the semiconductor cores of the bar-like structured light emitting elements are preferably not less than 500 nm but not more than 100 µm, and then the variation in the diameters of the semiconductor cores can be reduced as compared with that in the bar-like structured light emitting elements with diameters of tens to hundreds of nanometers, so that reduction in variation in the light emitting area, i.e., variation in light emitting characteristics and improvement in the yield can be attained.

If specified, lower limit of the light emitting area of the bar-like structured light emitting elements is $3.14*10^{-3}$ µm$^2$ (the area of the element in which the cylindrical light emitting surface is formed on the outer periphery of the bar-like semiconductor core having the diameter of 1 nm and the length of 1 µm). If the light emitting element is shaped like a square plate, each side is 56 nm in length. It is difficult to form light emitting elements having sizes not larger than the lower limit with any shape. Upper limit of the number of the light emitting elements placed on the mounting surface of the one substrate is one hundred million, if specified, and it is difficult to array the upper limit or larger number of elements while keeping the yield.

Though the MOCVD device is used to cause the crystal growth of the semiconductor cores, cap layer and the like in the second embodiment, other crystal growth devices such as MBE (molecular beam epitaxial) device may be used to form the semiconductor cores, the cap layer and the like.

The specific embodiments of the invention have been described above; however, the invention is not limited to the embodiments and can be embodied with modifications in various ways within the scope of the invention.

In a light emitting device according to an aspect of the present invention, one hundred or more light emitting elements each having a light emitting area of $900\pi$ µm$^2$ or less are placed on a mounting surface of one substrate.

The light emitting elements are not limited to light emitting elements having flat light emitting surfaces in shape of circles, ellipses, squares, rectangles, polygons or the like but may be light emitting elements having light emitting surfaces formed of curved surfaces in shape of cylinders, ridges, hemispheres or the like. The light emitting elements are in direct contact with the substrate or are in contact with the substrate through thermal conductor and those light emitting elements in contact therewith in both manners may be combined.

In the light emitting device in which the light emitting elements each having the area of the light emitting surface of $900\lambda$ µm$^2$ or less are placed on the mounting surface of the one substrate, lateral heat outflow toward the substrate occurs also in a center part of each light emitting surface, with the light emitting elements being in direct contact (or indirect contact through the thermal conductor) with the substrate, and thus the temperatures of the light emitting element including the temperature of the center part of the light emitting surface are decreased, so that the increase in the temperatures in light emission is suppressed. By the placement of one hundred or more such minute light emitting elements on the mounting surface of the one substrate, variation in luminance in total on condition that the light emitting elements having a variation in luminance are gathered up can be decreased to not more than one-tenth of the variation in luminance of one light emitting element. There is a variation among elements in quantity of decrease in efficiency of light emission of the light emitting element that is caused by the increase in the temperatures thereof, whereas the setting of the area of the light emitting surface of each light emitting element to $900\pi \,\mu m^2$ or less suppresses the increase in the temperatures and the variation in the quantity of decrease in the efficiency of light emission, further enhancing an effect of reducing the variation in luminance that is attained by using one hundred or more minute light emitting elements. Furthermore, the microminiaturization of the light emitting elements and the dispersive placement thereof on the mounting surface of the one substrate make it possible to reduce the light intensity by dispersion of light projected onto the resin, while the quantity of light as much as that of one light emitting element is obtained from the plurality of minute light emitting elements, for instance, and thus the suppression of deterioration of the resin and the extension of the life of the light emitting device can be attained. Thus, little variation in luminance, long life, and high efficiency can be fulfilled by such dispersion of light emission with the suppression of the increase in the temperatures in the light emitting operation.

In one embodiment, an area of the mounting surface of the substrate is equal to or larger than four times as large as a sum total of the light emitting areas of the light emitting elements, and the light emitting elements are placed on the mounting surface of the substrate while being dispersed uniformly in general.

In the embodiment, the light emitting elements are placed with generally uniform dispersion on the substrate having an area equal to or larger than four times the sum total of the light emitting areas of the light emitting elements, and thus lateral outflow of heat produced in the light emitting elements by light emission is efficiently caused, so that the suppression of the increase in the temperatures in the light emitting operation, the extension of the life and the increase in the efficiency are further attained.

Figure 39:
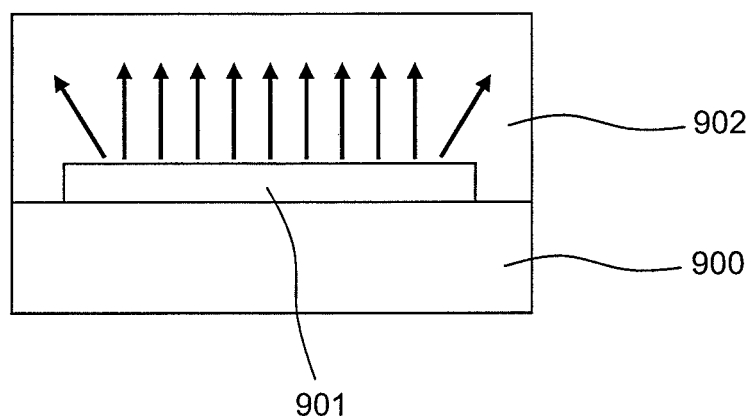
FIG. 39 is a schematic section of a conventional light emitting device.
Figure 40:
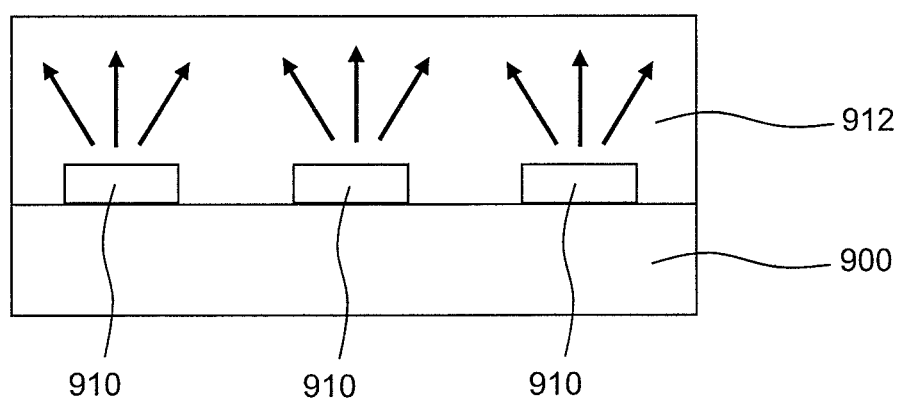
FIG. 40 is a schematic section of a light emitting device in accordance with the invention.
Figure 41:
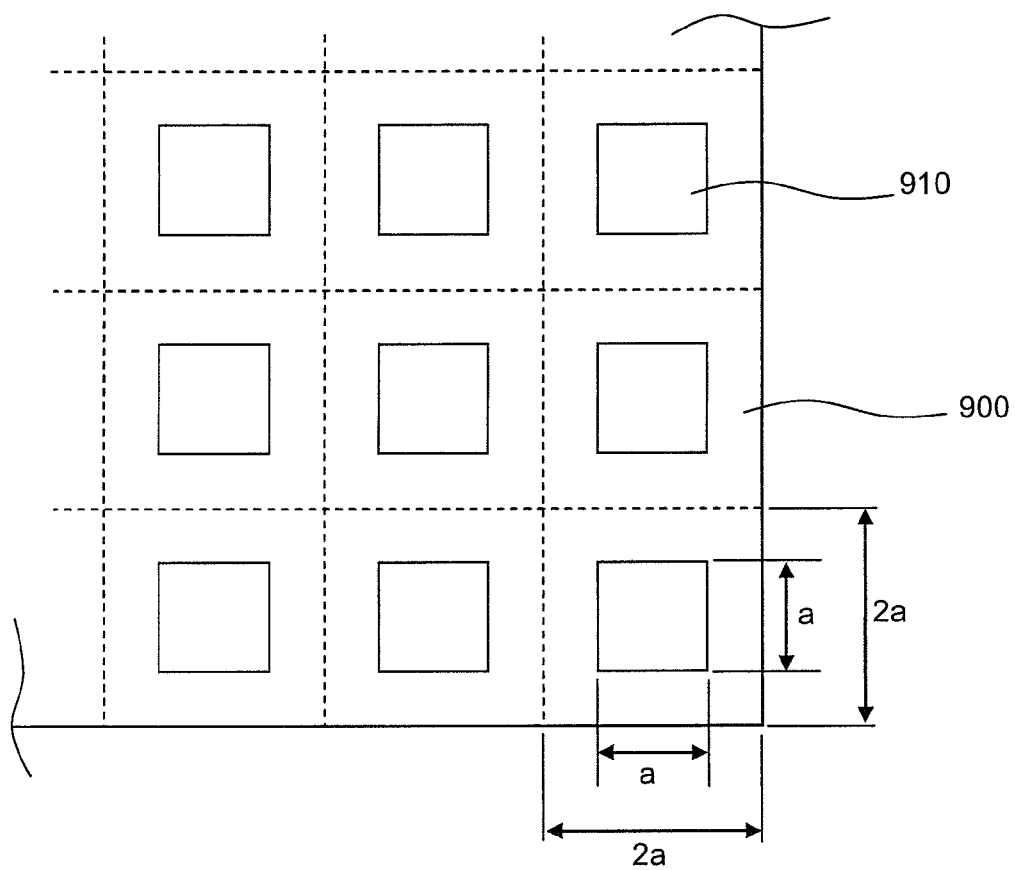
FIG. 41 is a schematic plan view of the light emitting device in accordance with the invention.

As shown in FIGS. 40 and 41, for instance, light emitting elements 910 having light emitting surfaces that each have area of $900\pi \,\mu m2$ or less and that are in shape of flat squares (with length a of each side) are placed on a square substrate 900 while being dispersed uniformly in general. Provided that an area of a portion of the substrate 900 that is assigned to one light emitting element 910 is four times ($4a^2$) the light emitting area ($a^2$) of the one light emitting element 910, light intensity can be decreased by the dispersion of the light emission from the light emitting elements 910 while sufficient distance between light emitting elements 910 adjacent to each other is ensured as shown in FIGS. 40 and 41 and thus deterioration of resin 912 can be suppressed, as compared with the conventional single light emitting element (LED chip 901) shown in FIG. 39.

In one embodiment, the light emitting elements are in shape of bars, and the light emitting elements are placed on the mounting surface of the substrate so that longitudinal directions of the light emitting elements parallel the mounting surface of the substrate.

According to the embodiment, the placement of the light emitting elements in shape of bars on the mounting surface of the substrate such that the longitudinal directions of the light emitting elements are parallel to the mounting surface of the substrate increases a ratio of a length in an axial direction (longitudinal direction) of the light emitting element to that in a radial direction thereof. This causes more efficient lateral heat outflow toward the substrate than in a configuration with flat square light emitting surfaces under condition that the areas of the light emitting surfaces are equal, making it possible to further enhance the suppression of the increase in the temperatures in the light emitting operation, the extension of the life, and the increase in the efficiency.

In one embodiment, the light emitting elements in shape of bars each have a cylindrical light emitting surface that concentrically surrounds a bar-like core.

Because the light emitting elements in shape of bars each have the cylindrical light emitting surface that concentrically surrounds the bar-like semiconductor core, it is possible to increase the area of the light emitting surface of each light emitting element, reduce the number of the light emitting elements required for obtaining a specified luminance, and reduce costs therefor, within a condition that the one hundred or more light emitting elements each having the area of the light emitting surface of $900\pi \,\mu m^2$ or less are placed on the mounting surface of the one substrate.

In one embodiment, the light emitting elements are light emitting diodes. The light emitting diodes are connected between a first electrode and a second electrode that are formed with specified spacing between on the substrate. The light emitting diodes comprise first light emitting diodes each having an anode connected to the first electrode and a cathode connected to the second electrode and second light emitting diodes each having a cathode connected to the first electrode and an anode connected to the second electrode, the first and second light emitting diodes being mixed and placed on the substrate. And, the light emitting diodes are driven by an AC power supply applying AC voltages between the first electrode and the second electrode.

According to the embodiment, manufacturing process steps can be simplified because it is unnecessary to place the large number of light emitting diodes with unification of orientations of the anodes and the cathodes thereof. It is unnecessary to array the light emitting diodes connected between the first electrode and the second electrode with unification of polarity thereof, and thus a step of unifying the polarity (orientations) of the light emitting diodes in the manufacture is made unnecessary, so that the manufacturing process can be simplified. In addition, it is unnecessary to provide marks on the light emitting diodes in order to identify the polarity (orientations) of the light emitting diodes, and it is made unnecessary to form the light emitting diodes in special shape for the identification of the polarity. Accordingly, the steps for manufacturing the light emitting diodes can be simplified and costs for manufacturing the same can be reduced. On condition that the light emitting diodes are small in size and/or great in number, the manufacturing steps can noticeably be simplified as compared with arraying of light emitting diodes with the unification of the polarity thereof.

In one embodiment, the substrate is mounted on a radiator plate.

According to the embodiment, heat radiation effect is further improved by mounting the substrate on the radiator plate.

The present invention also provides a method of manufacturing a light emitting device in which one hundred or more light emitting elements each having a light emitting area of $900\pi \,\mu m^2$ or less are placed on a mounting surface of one substrate, the method comprising:

a substrate production step of producing a substrate having at least a first electrode and a second electrode on a mounting surface thereof, an application step of applying solution containing a plurality of light emitting elements onto the substrate, and an arraying step of arraying the plurality of light emitting elements in positions defined at least by the first electrode and the second electrode by applying voltages at least to the first electrode and the second electrode.

According to the configuration, the substrate having at least the first electrode and the second electrode on the mounting surface is produced, and liquid containing a plurality of minute light emitting elements is applied onto the substrate. After that, the plurality of minute light emitting elements are arrayed in the positions, defined at least by the first electrode and the second electrode, by the application of the voltages at least to the first electrode and the second electrode. Thus the plurality of light emitting elements can easily be arrayed in the specified positions on the substrate. Accordingly, it is unnecessary to place light emitting diodes one by one in specified positions on a substrate as in conventional devices, and a large number of minute light emitting diodes can accurately be placed in the specified positions.

By the method of manufacturing the light emitting device, the light emitting device can be provided in which little variation in luminance, long life, and high efficiency can be fulfilled by the dispersion of light emission with the suppression of the increase in the temperatures in the light emitting operation. In the method of manufacturing the light emitting device, quantity of semiconductor that is used can be reduced by use of the semiconductor only for the plurality of minute light emitting elements.

In one embodiment, the method further comprises a substrate division step of dividing the substrate into a plurality of divided substrates after the arraying step. One hundred or more light emitting elements are placed on each of the plurality of divided substrates.

According to the embodiment, the plurality of light emitting elements are arrayed on the substrate having a large area, and then the substrate is divided into the plurality of divided substrates each having one hundred or more light emitting elements placed thereon, so that reduction in number of the substrates flowing in each step and substantial cost reduction can be attained.

In one embodiment, at least the first electrode and the second electrode are used as electrodes for driving the plurality of light emitting elements.

According to the embodiment, an interconnection step can be simplified and costs can be reduced by the use of at least the first electrode and the second electrode as the electrodes for driving the plurality of light emitting elements.

In one embodiment, the method further comprises, after the arraying step, a fluorescent substance application step of selectively applying fluorescent substance onto areas on the substrate where the plurality of light emitting elements are placed.

According to the embodiment, cost reduction through saving in used amount of the fluorescent substance of which a material cost makes up a large percentage of a total material cost can be attained by the selective application of the fluorescent substance onto the areas on the substrate where the plurality of light emitting elements are placed after arraying of the plurality of light emitting elements on the substrate.

In one embodiment, the plurality of light emitting elements are in shape of bars, and the plurality of light emitting elements are placed on the mounting surface of the substrate so that longitudinal directions of the plurality of light emitting elements parallel the mounting surface of the substrate.

According to the embodiment, the method of manufacturing the light emitting device, which makes use of polarization of an object by application of voltage between electrodes, is convenient for causing polarization of both ends of the bar-like light emitting element and congenial to the bar-like light emitting element.

In one embodiment, the light emitting elements in shape of bars each have a cylindrical light emitting surface that concentrically surrounds a bar-like core.

According to the embodiment, due to the bar-like light emitting elements each having the cylindrical light emitting surface that concentrically surrounds the bar-like semiconductor core, it is possible to increase the area of the light emitting surface of each light emitting element and reduce number of the light emitting elements required for obtaining a specified luminance, within a condition that the one hundred or more bar-like light emitting elements having the area of the light emitting surface per each of $900\pi\ \mu m^2$ or less are placed on the mounting surface of the one substrate.

In one embodiment, the light emitting elements in shape of bars each have a first conductive type bar-like semiconductor core and a second conductive type cylindrical semiconductor layer that is formed so as to cover an outer periphery of the semiconductor core, and one end part of the semiconductor core of each of the light emitting elements in shape of bars is exposed.

According to the embodiment, the bar-like light emitting elements each having the first conductive type bar-like semiconductor core and the second conductive type cylindrical semiconductor layer that is formed so as to cover the outer periphery of the semiconductor core with the one end part of the semiconductor core exposed facilitate interconnections because connection of one electrode to the exposed one end part of the semiconductor core and connection of the electrode to the semiconductor layer on the other end part of the semiconductor core can be attained with the electrodes connected to both the ends with spacing therebetween so that short circuit between the electrode connected to the semiconductor layer and the exposed part of the semiconductor core is prevented.

An illuminating device according to an aspect of the present invention comprises the light emitting device according to any one of the embodiments as mentioned above.

Use of the light emitting device in the illuminating device makes it possible to achieve little variation in luminance, long life, and high efficiency.

A backlight according to the present invention comprises the light emitting device according to any one of the embodiments as mentioned above.

Use of the light emitting device in the backlight makes it possible to achieve little variation in luminance, long life, and high efficiency.

The invention claimed is:

1. A light emitting device comprising:
a substrate having a mounting surface; and
one hundred or more light emitting elements placed on the mounting surface of the substrate, the light emitting elements each having a light emitting area of $2,500\pi\ \mu m^2$ or less,
at least one of the light emitting elements being in shape of a bar, the at least one light emitting element in shape of a bar having a cylindrical light emitting surface that concentrically surrounds a bar-like core, no pn junctions, which are perpendicular to an axis direction of the bar, existing in the middle of the bar, and an area of the mounting surface of the substrate being equal to or larger than four times as large as a sum total of the light emitting areas of the light emitting elements.

2. The light emitting device as claimed in claim 1, wherein the bar-like core of the at least one light emitting element is an n-type semiconductor core, and the at least one light emitting element has a cylindrical p-type semiconductor layer covering an outer peripheral surface of the n-type semiconductor core.

3. The light emitting device as claimed in claim 1, wherein the light emitting area of each of the light emitting elements is not larger than $625\pi\ \mu m^2$.

4. The light emitting device as claimed in claim 3, wherein difference between a center temperature of the light emitting surface and an end part temperature of the light emitting surface is around zero during light emitting operations of the light emitting elements.

5. The light emitting device as claimed in claim 1, wherein the light emitting elements are placed on the mounting surface of the substrate while being dispersed uniformly in general.

6. An illuminating device comprising the light emitting device as claimed in claim 1.

7. A backlight comprising the light emitting device as claimed in claim 1.

8. A light emitting device comprising:

a substrate having a mounting surface; and one hundred or more light emitting elements placed on the mounting surface of the substrate, the light emitting elements each having a light emitting area of $2,500\pi\ \mu m^2$ or less, an area of the mounting surface of the substrate being equal to or larger than four times as large as a sum total of the light emitting areas of the light emitting elements.

9. The light emitting device as claimed in claim 8, wherein the light emitting area of each of the light emitting elements is not larger than $625\pi\ \mu m^2$.

10. The light emitting device as claimed in claim 9, wherein difference between a center temperature of the light emitting surface and an end part temperature of the light emitting surface is around zero during light emitting operations of the light emitting elements are emitting light.

11. The light emitting device as claimed in claim 8, wherein the light emitting elements are dispersed uniformly in general on the mounting surface of the substrate.

12. The light emitting device as claimed in claim 8, wherein each of the light emitting elements has a flat light emitting surface or a cylindrical light emitting surface.

13. An illuminating device comprising the light emitting device as claimed in claim 8.

14. A backlight comprising the light emitting device as claimed in claim 8.

* * * * *